(12) United States Patent
Shin et al.

(10) Patent No.: US 12,107,061 B2
(45) Date of Patent: Oct. 1, 2024

(54) INTEGRATED CIRCUIT DEVICE INCLUDING PERIPHERAL CIRCUIT AND CELL ARRAY STRUCTURES, AND ELECTRONIC SYSTEM INCLUDING SAME

(71) Applicant: SAMSUNG ELECTRONICS CO., LTD., Suwon-si (KR)

(72) Inventors: Homoon Shin, Hwaseong-si (KR); Jooyong Park, Hwaseong-si (KR); Hongsoo Jeon, Suwon-si (KR); Pansuk Kwak, Goyang-si (KR)

(73) Assignee: Samsung Electronics Co., Ltd. (KR)

( * ) Notice: Subject to any disclaimer, the term of this patent is extended or adjusted under 35 U.S.C. 154(b) by 142 days.

(21) Appl. No.: 17/513,132

(22) Filed: Oct. 28, 2021

(65) Prior Publication Data

US 2022/0181284 A1   Jun. 9, 2022

(30) Foreign Application Priority Data

Dec. 8, 2020  (KR) .................. 10-2020-0170752

(51) Int. Cl.
*H01L 25/065* (2023.01)
*H01L 23/00* (2006.01)
*H01L 25/00* (2006.01)
*H01L 25/18* (2023.01)

(52) U.S. Cl.
CPC ............. *H01L 24/08* (2013.01); *H01L 24/80* (2013.01); *H01L 25/0657* (2013.01); *H01L 25/18* (2013.01); *H01L 25/50* (2013.01); *H01L 2224/08145* (2013.01); *H01L 2224/80895* (2013.01); *H01L 2224/80896* (2013.01); *H01L 2924/1431* (2013.01); *H01L 2924/14511* (2013.01)

(58) Field of Classification Search
CPC ..... H01L 25/0657; H01L 24/08; H01L 25/18; H01L 2224/08145; H01L 2924/1431; H01L 2924/14511; H01L 2224/80895; H01L 2224/80896

See application file for complete search history.

(56) References Cited

U.S. PATENT DOCUMENTS

| 9,305,935 | B2 | 4/2016 | Lee et al. |
| 9,595,346 | B2 | 3/2017 | Lee et al. |
| 9,666,289 | B2 | 5/2017 | Lee et al. |

(Continued)

FOREIGN PATENT DOCUMENTS

| KR | 1020160124294 | 10/2016 |
| KR | 1020200032872 | 10/2016 |
| KR | 1020190123880 | 11/2019 |

*Primary Examiner* — Thanh Y. Tran
(74) *Attorney, Agent, or Firm* — Fish & Richardson P.C.

(57) ABSTRACT

An integrated circuit device includes; a peripheral circuit structure including a peripheral circuit, a first insulating layer covering the peripheral circuit, extension lines in the first insulating layer, and a first bonding pad in the first insulating layer, and a cell array structure including a conductive plate, a memory cell array below the conductive plate, a second insulating layer covering the memory cell array, a second bonding pad in the second insulating layer, a conductive via on the conductive plate, and a line connected to the conductive via. The first bonding pad contacts the second bonding pad, and the integrated circuit device further includes contact plugs electrically connecting the line to the extension lines.

20 Claims, 18 Drawing Sheets

(56) References Cited

U.S. PATENT DOCUMENTS

| | | |
|---|---|---|
| 9,837,429 B2 | 12/2017 | Son et al. |
| 10,748,924 B2 | 8/2020 | Kim |
| 2020/0091185 A1 | 3/2020 | Baek |
| 2021/0407968 A1* | 12/2021 | Kim ................. H01L 29/42344 |
| 2022/0189984 A1* | 6/2022 | Okina ................. H01L 23/5226 |
| 2022/0285233 A1* | 9/2022 | Li ........................... H01L 22/14 |
| 2023/0065384 A1* | 3/2023 | Zhang .................... H01L 25/50 |

* cited by examiner

INTEGRATED CIRCUIT DEVICE INCLUDING PERIPHERAL CIRCUIT AND CELL ARRAY STRUCTURES, AND ELECTRONIC SYSTEM INCLUDING SAME

CROSS-REFERENCE TO RELATED APPLICATION

This application claims priority under 35 U.S.C. § 119 to Korean Patent Application No. 10-2020-0170752 filed on Dec. 8, 2020 in the Korean Intellectual Property Office, the subject matter of which is hereby incorporated by reference.

BACKGROUND

The inventive concept relates generally to integrated circuit devices and electronic systems including same. More particularly, the inventive concept relates to integrated circuit devices including non-volatile vertical memory device(s) and electronic systems including same.

In order to meet emerging performance demands under existing commercial constraints, it has become necessary to increase integration density of integrated circuit devices. In particular, the degree of memory device integration has become an important factor in determining cost. Because the degree of integration of two-dimensional (or horizontal) memory devices is primarily determined by a unit memory cell area, it is greatly influenced by the level of fine pattern formation technology. However, increasingly expensive equipment is required to form increasingly fine patterns, so the area of chip dies is economically limited. Thus, although the degree of integration of two-dimensional memory devices may be further increased, it is quite costly to do so. Accordingly, a three-dimensional (or vertical) memory devices have become the subject of much research and development.

SUMMARY

The inventive concept provides integrated circuit devices having increased integration by securing an arrangement region of memory cells by forming, in a vertical memory device, a line connecting a common source line to a common source line driver on a surface opposite to a surface on which a memory cell array is formed.

According to an aspect of the inventive concept, there is provided an integrated circuit device including; a peripheral circuit structure and a cell array structure. The peripheral circuit structure includes; a circuit substrate, a peripheral circuit on the circuit substrate, a first insulating layer covering the circuit substrate and the peripheral circuit, and a first bonding pad in the first insulating layer. The cell array structure includes; an insulating structure having a first surface and an opposing second surface, a conductive plate on the first surface of the insulating structure, a memory cell array on the conductive plate, a second insulating layer covering the first surface of the insulating structure, the conductive plate, and the memory cell array, a second bonding pad arranged in the second insulating layer in contact with the first bonding pad, a line on the second surface of the insulating structure, and a conductive via penetrating the insulating structure and connecting the conductive plate to the line. The integrated circuit device further comprises contact plugs electrically connecting the line to the peripheral circuit.

According to an aspect of the inventive concept, there is provided an integrated circuit device including; a peripheral circuit structure including a peripheral circuit, a first insulating layer covering the peripheral circuit, extension lines in the first insulating layer, and a first bonding pad in the first insulating layer, and a cell array structure including a conductive plate, a memory cell array below the conductive plate, a second insulating layer covering the memory cell array, a second bonding pad in the second insulating layer, a conductive via on the conductive plate, and a line connected to the conductive via, wherein the first bonding pad contacts the second bonding pad, and the integrated circuit device further includes contact plugs electrically connecting the line to the extension lines.

According to an aspect of the inventive concept, there is provided an electronic system including; a main substrate, an integrated circuit device on the main substrate, and a controller electrically connected to the integrated circuit device on the main substrate. The integrated circuit device include; a peripheral circuit structure including a peripheral circuit, a first insulating layer covering the peripheral circuit, a first bonding pad in the first insulating layer, and a cell array structure including a conductive plate, a memory cell array below the conductive plate, a second insulating layer covering the memory cell array, a second bonding pad in the second insulating layer, a conductive via on the conductive plate, and a line connected to the conductive via. The first bonding pad contacts the second bonding pad, and the integrated circuit device further comprises contact plugs electrically connecting the line to the peripheral circuit.

BRIEF DESCRIPTION OF THE DRAWINGS

Embodiments of the inventive concept will be more clearly understood from the following detailed description taken in conjunction with the accompanying drawings in which.

DETAILED DESCRIPTION

Throughout the written description and drawings, like reference numbers and labels are used to denote like or similar elements and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
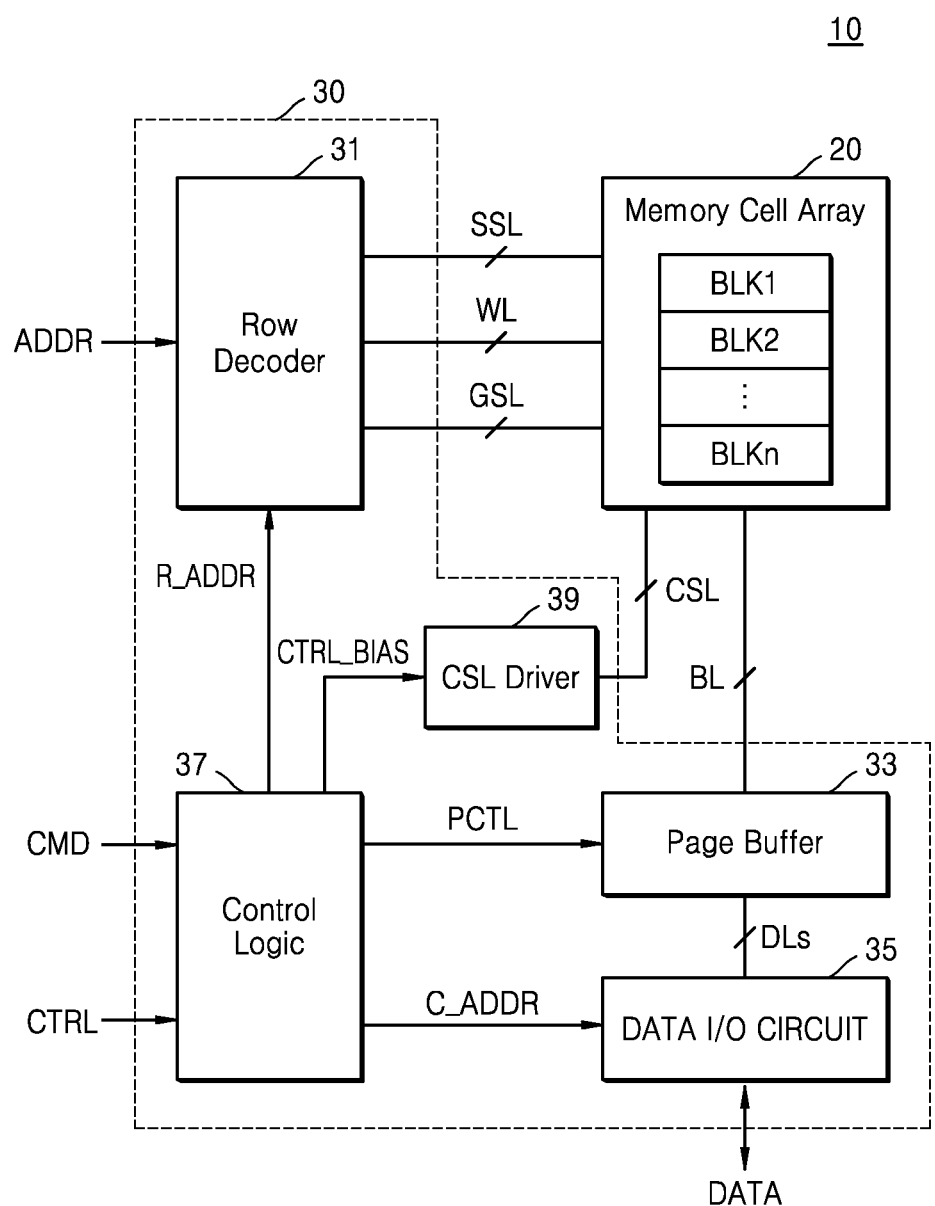
FIG. 1 is a block diagram illustrating an integrated circuit device according to embodiments of the inventive concept.

FIG. 1 is a block diagram illustrating an integrated circuit device 10 according to embodiments of the inventive concept.

Referring to FIG. 1, the integrated circuit device 10 generally includes a memory cell array 20 and a peripheral circuit 30.

The memory cell array 20 includes memory cell blocks BLK1, BLK2, . . . , and BLKn. The memory cell blocks BLK1, BLK2, . . . , and BLKn may each include a number of memory cells. The memory cell blocks BLK1, BLK2, . . . , and BLKn may be connected to the peripheral circuit 30 through a bit line BL, a word line WL, a string selection line SSL, and a ground selection line GSL.

The memory cell array 20 may be connected to a page buffer 33 through the bit line BL and may be connected to a row decoder 31 through the word line WL, the string selection line SSL, and the ground selection line GSL. In the memory cell array 20, each of the memory cells included in the memory cell blocks BLK1, BLK2, . . . , and BLKn may be a flash memory cell. The memory cell array 20 may include a three-dimensional (3D) memory cell array. The 3D memory cell array may include NAND strings, wherein each of the NAND strings includes vertically stacked memory cells connected to word lines WL.

The peripheral circuit 30 may include the row decoder 31, the page buffer 33, a data input/output (I/O) circuit 35, a control logic 37, and a common source line driver 39. Although not shown in FIG. 1, the peripheral circuit 30 may further include various circuits such as a voltage generating circuit generating various voltages required for an operation of the integrated circuit device 10, an error correction circuit correcting an error of data read from the memory cell array 20, an input/output interface, or the like.

The peripheral circuit 30 may receive at least one of an address ADDR, a command CMD, and a control signal CTRL from an external device, and may transmit data to and/or receive data from the external device. One example configuration of the peripheral circuit 30 will be described below in some additional detail.

The row decoder 31 may select at least one memory cell block from among the memory cell blocks BLK1, BLK2, . . . , and BLKn in response to the address ADDR, and may select a word line WL, a string selection line SSL, and/or a ground selection line GSL of the selected memory cell block. The row decoder 31 may provide the word line WL of the selected memory cell block with voltage(s) for performing a memory operation.

The page buffer 33 may be connected to the memory cell array 20 through the bit line BL. During a program operation, the page buffer 33 may operate as a write driver to apply, to the bit line BL, a voltage according to the data which is to be stored in the memory cell array 20. During a read operation, the page buffer 33 may operate as a sense amplifier to sense the data stored in the memory cell array 20. The page buffer 33 may operate according to a control signal PCTL provided from the control logic 37.

The data I/O circuit 35 may be connected to the page buffer 33 through data lines DLs. In a program operation, the data I/O circuit 35 may receive the data from a memory controller (not shown), and may provide program data to the page buffer 33 based on a column address C_ADDR provided from the control logic 37. In a read operation, the data I/O circuit 35 may provide the memory controller with read data stored in the page buffer 33 based on the column address C_ADDR provided from the control logic 37. The data I/O circuit 35 may transfer, to the control logic 37 or the row decoder 31, an address or a command input thereto.

The control logic 37 may receive the command CMD and the control signal CTRL from the memory controller. The control logic 37 may provide a row address R_ADDR to the row decoder 31 and may provide the column address C_ADDR to the data I/O circuit 35. The control logic 37 may generate various internal control signals used in the integrated circuit device 10 in response to the control signal CTRL. For example, the control logic 37 may adjust a voltage level provided to the word line WL and the bit line BL in performing a memory operation such as a read operation, a program operation, an erase operation, etc.

The common source line driver 39 may be connected to the memory cell array 20 through a common source line CSL. The common source line driver 39 may apply, to the common source line CSL, a common source voltage (e.g., a power supply voltage) or a ground voltage under a control of the control logic 37.

Figure 2:
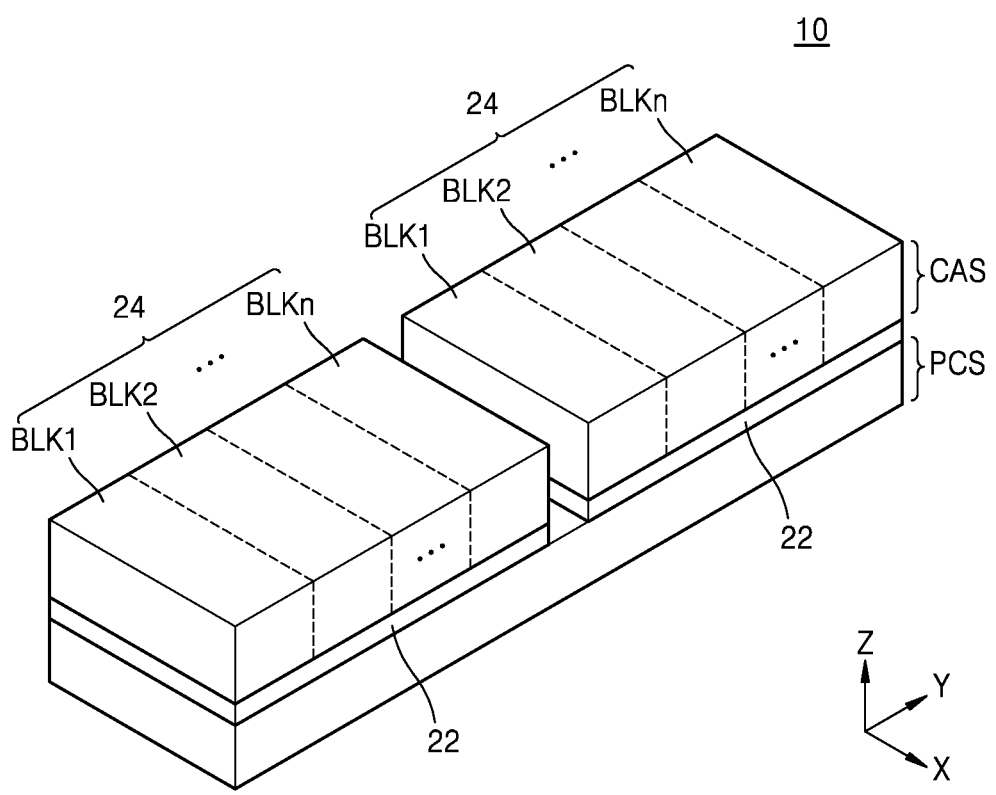
FIG. 2 is a perspective view further illustrating in one example the integrated circuit of FIG. 1.

FIG. 2 is a perspective view further illustrating in one example the integrated circuit device 10 of FIG. 1.

Referring to FIG. 2, the integrated circuit device 10 includes a peripheral circuit structure PCS and a cell array structure CAS arranged in a vertical stack (e.g., vertically overlapping one another, wholly or in part, in a vertical direction (e.g., the Z direction).

In some embodiments, the cell array structure CAS may include the memory cell array 20 of FIG. 1. In some embodiments, the peripheral circuit structure PCS may include the peripheral circuit 30 of FIG. 1.

A connection structure 22 may be disposed between the cell array structure CAS and the peripheral circuit structure PCS. The cell array structure CAS and the peripheral circuit structure PCS may be stacked in the vertical direction through the connection structure 22. The connection structure 22 may provide physical and/or connection between the cell array structure CAS and the peripheral circuit structure PCS. Electrical connection and data transmission between the cell array structure CAS and the peripheral circuit structure PCS may be made through the connection structure 22.

The connection structure 22 may include connection units configured to electrically connect the cell array structure CAS and the peripheral circuit structure PCS. For example, connection units may include a metal-metal bonding structure, a through silicon via (TSV), a back via stack (BVS), a eutectic bonding structure, a ball grid array (BGA) bonding structure, a lines, contact plugs, or a combination thereof. For example, the metal-metal bonding structure may include copper (Cu), aluminum (Al), tungsten (W), or a combination thereof.

The cell array structure CAS may include a number of tiles 24. The tiles 24 may each include the memory cell blocks BLK1, BLK2, ..., and BLKn, and the memory cell blocks BLK1, BLK2, ..., and BLKn may each include a vertically stacked memory cells.

Figure 3:
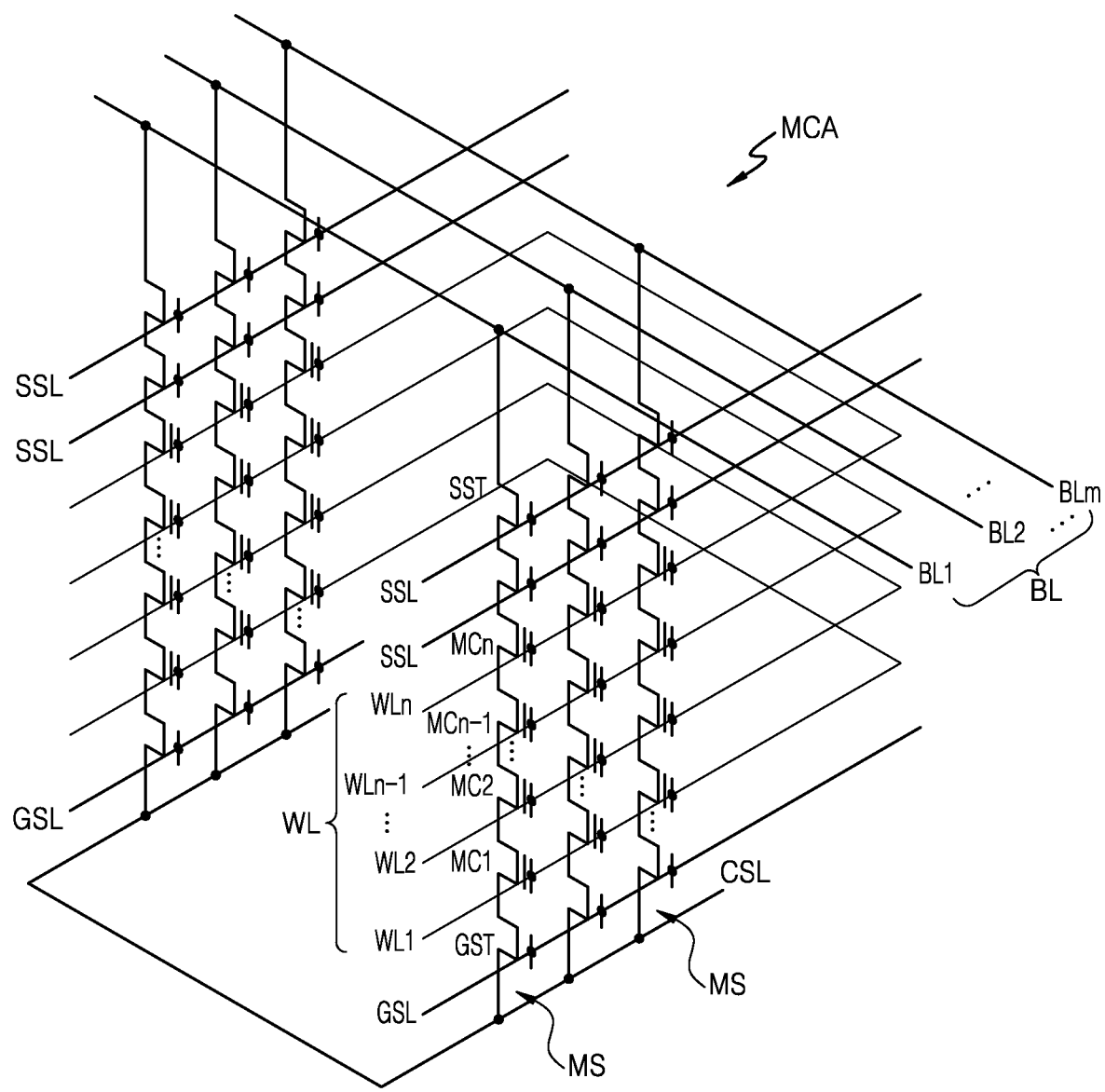
FIG. 3 is a partial equivalent circuit diagram of a memory cell array of an integrated circuit device according to embodiments of the inventive concept.

FIG. 3 is a partial equivalent circuit diagram of a memory cell array MCA (e.g., memory cell array 20 of FIG. 1) of an integrated circuit device according to embodiments of the inventive concept.

Referring to FIG. 3, an equivalent circuit diagram of a vertical NAND flash memory device having a vertical channel structure is illustrated.

The memory cell array MCA may include memory cell strings MS. The memory cell array MCA may include bit lines BL, word lines WL, at least one string selection line SSL, at least one ground selection line GSL, and a common source line CSL.

A memory cell strings MS may be formed between the bit lines BL and the common source line CSL. In FIG. 3, an example where each of the memory cell strings MS includes two (2) string selection lines SSL is illustrated, but the inventive concept is not limited thereto. For example, the memory cell strings MS may each include one (1) string selection line SSL.

The memory cell strings MS may each include a string selection transistor SST, a ground selection transistor GST, and cell transistors MC1, MC2, ..., MCn-1, and MCn. A drain region of the string selection transistor SST may be connected to a bit line BL, and a source region of the ground selection transistor GST may be connected to the common source line CSL. The common source line CSL may be a region in which source regions of ground selection transistors GST are commonly connected.

The string selection transistor SST may be connected to the string selection line SSL, and the ground selection transistor GST may be connected to the ground selection line GSL. The memory cell transistors MC1, MC2, ..., MCn-1, and MCn may be respectively connected to word lines WL1, WL2, ..., WLn-1, and WLn corresponding thereto.

Each of the memory cell blocks BLK1, BLK2, ..., and BLKn described above with reference to FIGS. 1 and 2 may include, for example, the memory cell array MCA having a circuit configuration described in FIG. 3.

Figure 4A:
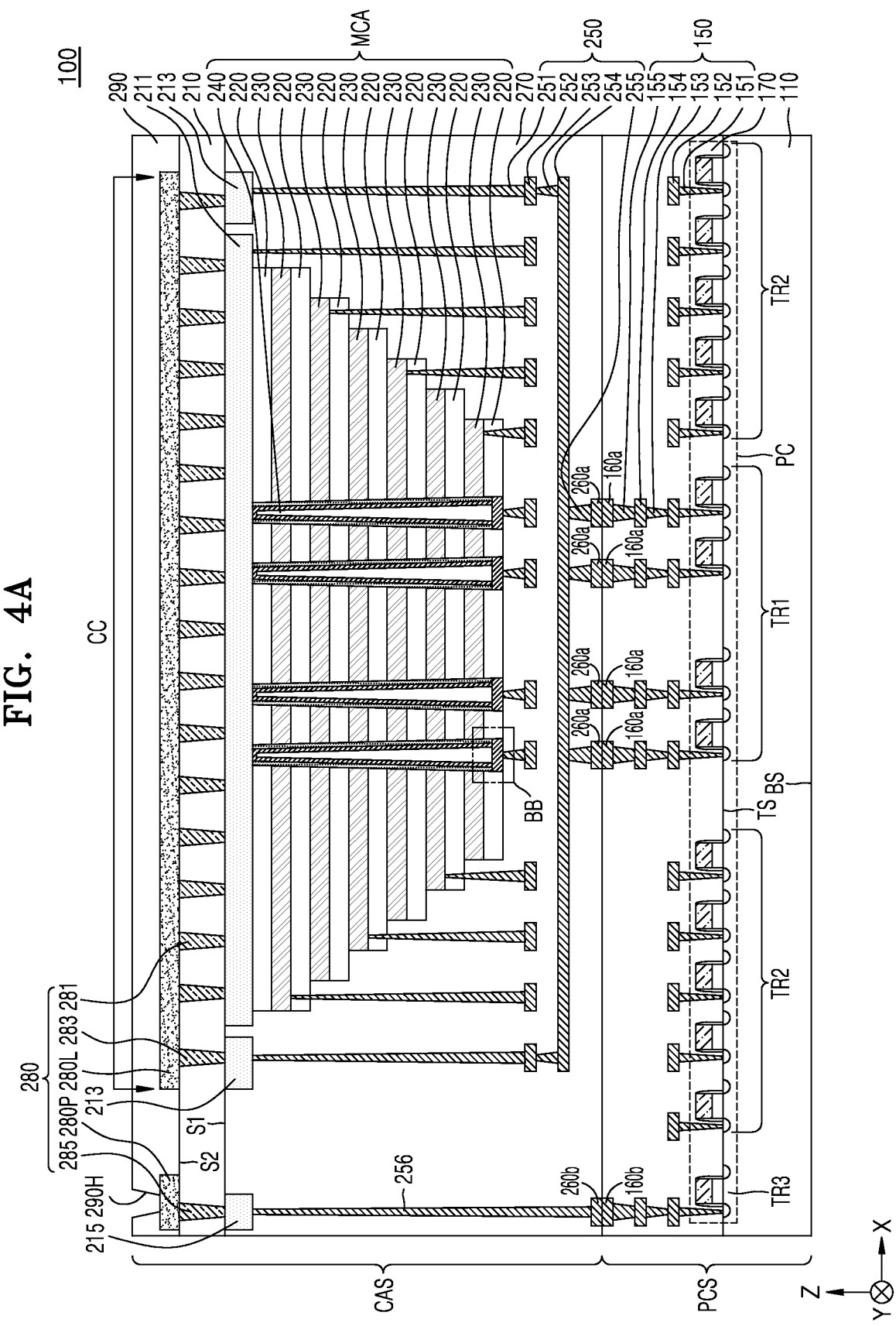
FIG. 4A is a cross-sectional view illustrating an integrated circuit device according to embodiments of the inventive concept.
Figure 4B:
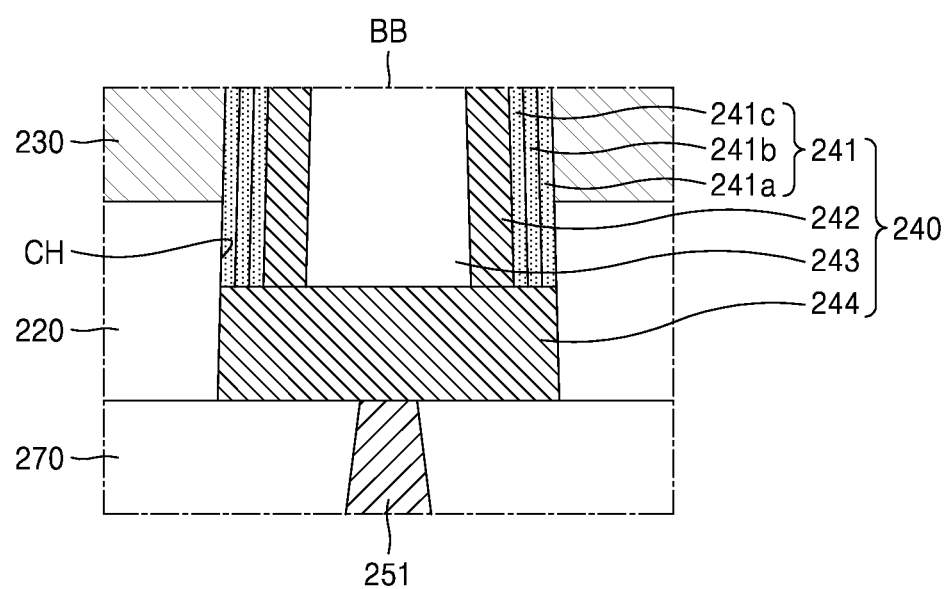
FIG. 4B is an enlarged view of a region 'BB' indicated in FIG. 4A.
Figure 4C:
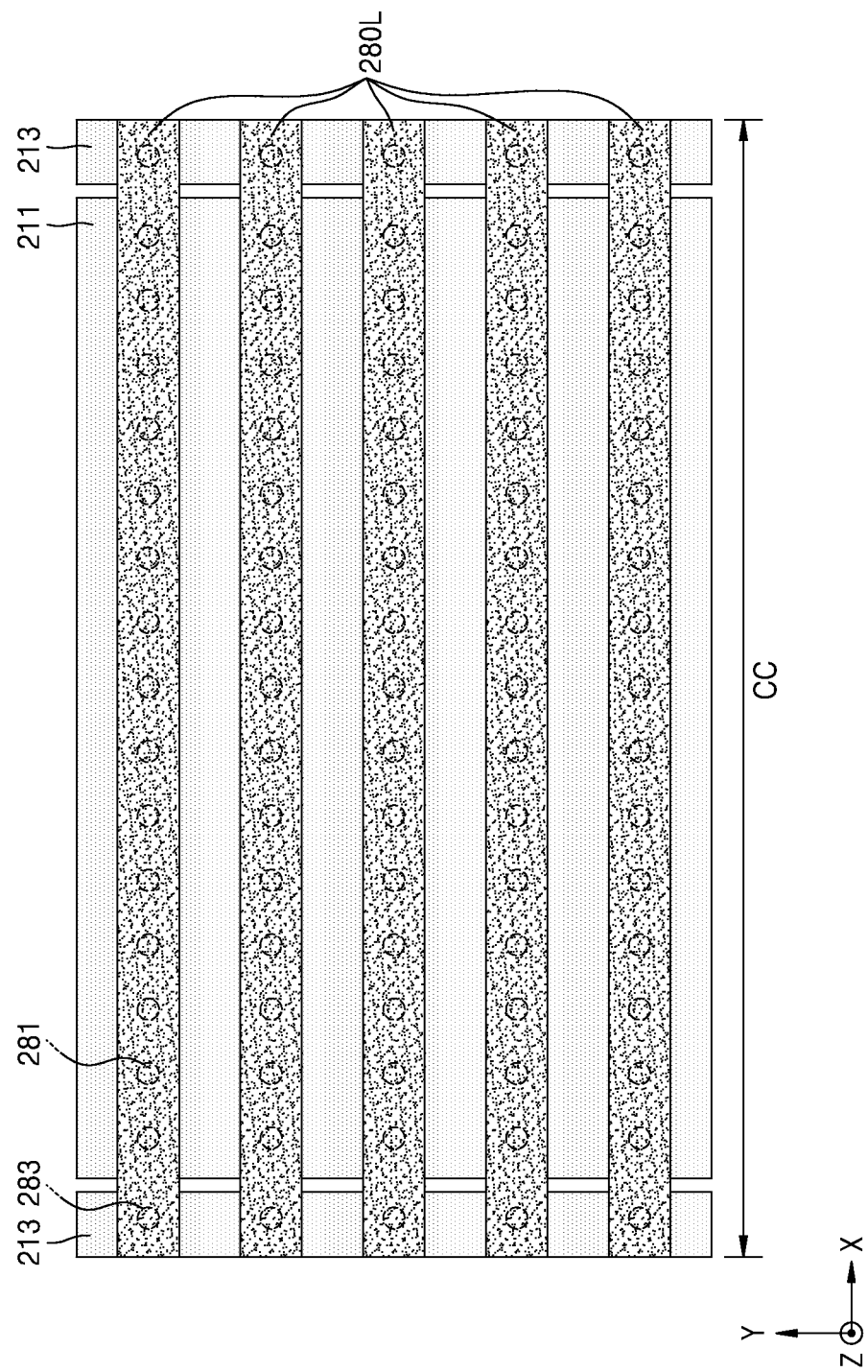
FIG. 4C is a plan (or top-down) view taken along line CC of FIG. 4A.

FIG. 4A is a cross-sectional view illustrating an integrated circuit device 100 according to embodiments of the inventive concept, FIG. 4B is an enlarged view of region 'BB' indicated in FIG. 4A, and FIG. 4C is a plan (or top-down) view taken along line CC of FIG. 4A.

Referring collectively to FIGS. 1, 4A, 4B and 4C, the integrated circuit device 100 may include a peripheral circuit structure PCS and a cell array structure CAS vertically stacked on the peripheral circuit structure PCS.

The peripheral circuit structure PCS may be coupled to the cell array structure CAS. For example, first bonding pads 160a and 160b of the peripheral circuit structure PCS may be coupled to second bonding pads 260a and 260b of the cell array structure CAS. In addition, a first insulating layer 170 of the peripheral circuit structure PCS may be coupled to a second insulating layer 270 of the cell array structure CAS.

In some embodiments, the peripheral circuit structure PCS may further include at least one first dummy bonding pad (not shown) in the first insulating layer 170. In addition, the cell array structure CAS may further include at least one second dummy bonding pad (not shown) in the second insulating layer 270. The at least one first dummy bonding pad may respectively contact the at least one second dummy bonding pad. The at least one first dummy bonding pad and the at least one second dummy bonding pad may contribute to a physical coupling between the peripheral circuit structure PCS and the cell array structure CAS, but may not contribute to an electrical connection therebetween.

The peripheral circuit structure PCS may include a circuit substrate 110, a peripheral circuit PC on a top surface TS of the circuit substrate 110, the first insulating layer 170 covering the circuit substrate 110 and the peripheral circuit PC, and the first bonding pads 160a and 160b arranged in the first insulating layer 170. In addition, the peripheral circuit structure PCS may include a first line structure 150.

The cell array structure CAS may include an insulating structure 210, a conductive plate 211 on a first surface S1 of the insulating structure 210, conductive lines 213 arranged on both side surfaces of the conductive plate 211, the memory cell array MCA on the conductive plate 211, the second insulating layer 270 covering the insulating structure 210 and the memory cell array MCA, and the second bonding pads 260a and 260b arranged in the second insulating layer 270. In addition, the cell array structure CAS may include a second line structure 250.

In the integrated circuit device 100 of FIGS. 4A, 4B and 4C, the cell array structure CAS may include a third line structure 280. In addition, the cell array structure CAS may include, on a second surface S2 of the insulating structure 210, a third insulating layer 290 insulating the third line structure 280.

One exemplary configuration of the peripheral circuit structure PCS will be described below in some additional detail.

The circuit substrate 110 may have the top surface TS and an opposing bottom surface BS. The circuit substrate 110 may include a bulk wafer or a wafer including an epitaxial growth. The circuit substrate 110 may include a Group IV semiconductor material, a Group III-V semiconductor material, and/or a Group II-VI semiconductor material. The Group IV semiconductor material may include, for example, silicon (Si), germanium (Ge), or silicon germanium (SiGe). The Group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, for example, zinc telluride (ZnTe) or cadmium sulfide (CdS).

The peripheral circuit PC may include a number of transistors (e.g., a first transistor TR1, a second transistor TR2, and a third transistor TR3).

The first transistor TR1 may be connected to the conductive plate 211 through the first line structure 150, the first bonding pad 160a, the second bonding pad 260a, the second line structure 250, and the third line structure 280. The first transistor TR1 may be a component of the common source line driver 39.

The second transistor TR2 may be connected to gate layers 230 and/or a channel pad 244 of a channel structure 240 through the first line structure 150, the first bonding pad 160a, the second bonding pad 260a, and the second line structure 250. The second transistor TR2 may be a component of the row decoder 31, the page buffer 33, or the control logic 37.

The third transistor TR3 may be connected to an I/O pad 280P through the first line structure 150, the first bonding band 160b, the second bond pad 260b, and the second line structure 250. The third transistor TR3 may be a component of the data I/O circuit 35.

The first line structure 150 may connect the peripheral circuit PC to the first bonding pads 160a and 160b. The first line structure 150 may include a first contact plug 151, a first conductive line 152, a first via 153, a second conductive line 154, and a second via 155. The first line structure 150 is illustrated as including two layers of conductive lines, that is, the first and second conductive lines 152 and 154, and two layers of vias, that is, the first and second vias 153 and 155, in FIG. 4A, but is not limited thereto. That is, the first contact plug 151 may connect the first conductive line 152 to the peripheral circuit PC. The first via 153 may connect the second conductive line 154 to the first conductive line 152. The second via 155 may connect the first bonding pads 160a and 160b to the second conductive line 154.

The first line structure 150 may include at least one metal material such as Cu, Al, W, silver (Ag), or gold (Au). In some embodiments, the first line structure 150 may further include a barrier material such as titanium (Ti), tantalum (Ta), titanium nitride (TiN), or tantalum nitride (TaN) to prevent the metal material from diffusing into the first insulating layer 170.

The first insulating layer 170 may be arranged to cover the circuit substrate 110 and the peripheral circuit PC. The first insulating layer 170 may include, for example, silicon oxide, silicon nitride, a low-k material, or a combination thereof. The low-k material is a material having a lower dielectric constant than that of silicon oxide, and may include, for example, phosphosilicate glass (PSG), borophosphosilicate glass (BPSG), fluorosilicate glass (FSG), organo-silicate glass (OSG), spin-on-glass (SOG), or a combination thereof.

An exemplary configuration of the cell array structure CAS will be described below in some additional detail.

The insulating structure 210 may include the first surface S1 and the opposing (or facing) second surface S2. The insulating structure 210 may include silicon oxide, silicon nitride, silicon oxynitride, or a combination thereof.

The conductive plate 211 and the conductive lines 213 may be arranged on the first surface S1 of the insulating structure 210. The conductive plate 211 may include a metal material, a semiconductor material, or a combination thereof. The conductive plate 211 may function as the common source line CSL of FIG. 3. The conductive plate 211 may support the memory cell array MCA. In addition, the conductive lines 213 may be arranged on both sides of the conductive plate 211 and may be disposed at substantially the same level as that of the conductive plate 211. The conductive lines 213 may include substantially the same material as the conductive plate 211. This may be because the conductive plate 211 and the conductive lines 213 are separated from one another by at least one material layer through a patterning operation. In some embodiments, a conductive pad 215 may be spaced apart from the conductive lines 213.

The memory cell array MCA may include interlayer insulating layers 220 and the gate layers 230, which are alternately stacked on the conductive plate 211, as well as channel structures 240 penetrating the interlayer insulating layers 220 and the gate layers 230. A planar area of the gate layers 230 may gradually decrease as a distance from the conductive plate 211 increases. The memory cell array MCA is shown including seven (7) interlayer insulating layers 220 and six (6) gate layers 230 in FIG. 4A, but is not limited thereto.

The interlayer insulating layers 220 may include silicon oxide, silicon nitride, a low-k material, or a combination thereof. The interlayer insulating layers 220 may include a material different from a material forming the second insulating layer 270.

The gate layers 230 may include at least one metal material such as Cu, Al, W, Ag, or Au. In some embodiments, each of the gate layers 230 may further include a barrier material such as Ti, Ta, TiN, or TiN to prevent the metal material from diffusing into the interlayer insulating layers 220.

Each of the channel structures 240 may be disposed in a channel hole CH penetrating the interlayer insulating layers 220 and the gate layers 230 in the vertical direction. Each of the channel structures 240 may include a gate insulating layer 241 on a side surface of the channel hole CH, a channel layer 242 on the gate insulating layer 241, a buried insulating layer 243 on the channel layer 242, and the channel pad 244 filling one end of the channel hole CH.

The gate insulating layer 241 may include a blocking insulating layer 241a, a charge storage layer 241b, and a tunneling insulating layer 241c, which are sequentially stacked on the channel hole CH. The blocking insulating layer 241a may include, for example, silicon oxide, silicon nitride, a metal oxide having a greater dielectric constant than that of silicon oxide, or a combination thereof. The charge storage layer 241b may include, for example, silicon nitride, boron nitride, polysilicon, or a combination thereof. The tunneling insulating layer 241c may include, for example, a metal oxide or silicon oxide.

The channel layer 242 may surround a side surface and one end portion of the buried insulating layer 243. The channel layer 242 may include a Group IV semiconductor material, a Group III-V semiconductor material, or a Group II-VI semiconductor material. In some embodiments, the channel layer 242 may include polysilicon.

The buried insulating layer 243 may fill a space surrounded by the channel layer 242 and the channel pad 244. The buried insulating layer 243 may include, for example, silicon nitride, silicon oxide, a low-k material, or a combination thereof. In some embodiments, the buried insulating layer 243 may include silicon oxide.

The channel pad 244 may contact the gate insulating layer 241, the channel layer 242, and the buried insulating layer 243. The channel pad 244 may include a semiconductor material such as Si, Ge, and SiGe, a metal material such as W, Ti, Al, Cu, Au, and Ag, a metal nitride such as TiN and TaN, or a combination thereof.

The second line structure 250 may connect the third line structure 280 to the second bonding pads 260a and 260b. In addition, the second line structure 250 may connect the memory cell array MCA to the second bonding pad 260a. The second line structure 250 may include a second contact plug 251, a third conductive line 252, a third via 253, a fourth conductive line 254, a fourth via 255, and an I/O contact plug 256. The second line structure 250 is illustrated as including two layers of conductive lines, that is, the third and fourth conductive lines 252 and 254, and two layers of vias, that is, the third and fourth vias 253 and 255, in FIG. 4A, but is not limited thereto.

That is, the second contact plug 251 may connect the third conductive line 252 to the memory cell array MCA or the conductive lines 213. For example, the second contact plug 251 may connect the third conductive line 252 to the gate layers 230 and the channel structures 240. In addition, the second contact plug 251 may connect the third conductive line 252 to the conductive lines 213. The third via 253 may connect the fourth conductive line 254 to the third conductive line 252. The fourth via 255 may connect the second bonding pad 260a to the fourth via 255. The I/O contact plug 256 may connect the second bonding pad 260b to the I/O pad 280P.

In the integrated circuit device 100 of FIGS. 4A, 4B and 4C, the fourth conductive line 254 may include an extension line arranged in the second insulating layer 270 and electrically connected to the second contact plug 251 connected to the conductive lines 213. The fourth conductive line 254 may be between the memory cell array MCA and the peripheral circuit structure PCS. The length of the fourth conductive line 254 may be greater than the length of the conductive plate 211.

The second line structure 250 may include a metal material such as Cu, Al, W, Ag, or Au. In some embodiments, the second line structure 250 may further include a barrier material such as Ti, Ta, TiN, or TaN to prevent the metal material from diffusing into the second insulating layer 270.

The second insulating layer 270 may include, for example, silicon oxide, silicon nitride, a low-k material, or a combination thereof. The low-k material is a material having a lower dielectric constant than that of silicon oxide, and may include, for example, PSG, BPSG, FSG, OSG, SOG, or a combination thereof.

The third line structure 280 may be formed inside the insulating structure 210 and on the second surface S2 of the insulating structure 210. The third line structure 280 may include conductive vias 281, 283, and 285, lines 280L, and the I/O pad 280P. The conductive vias 281, 283, and 285 may be formed by penetrating the insulating structure 210 and include a first conductive via 281, a second conductive via 283, and a third conductive via 285.

The first conductive via 281 may directly contact the conductive plate 211 and the lines 280L to provide an electrical connection therebetween. The first conductive via 281 may have a tapered shape defined by a width that gradually increases as a distance from the conductive plate 211 increases.

The second conductive via 283 may directly contact the conductive lines 213 and the lines 280L to provide an electrical connection therebetween. The second conductive via 283 may have a tapered shape defined by a width that gradually increases as a distance from the conductive lines 213 increases.

The third conductive via 285 may directly contact the conductive pad 215 and the I/O pad 280P to provide an electrical connection therebetween. The third conductive via 285 may have a tapered shape defined by a width that gradually increases as a distance from the conductive pad 215 increases. In some embodiments, when a planar area of the insulating structure 210 is less than a planar area of the circuit substrate 110, the insulating structure 210 is not formed in a region where the third conductive via 285 is arranged, and thus, the third conductive via 285 may not penetrate the insulating structure 210.

The conductive vias 281, 283, and 285 may include at least one metal material such as Cu, Al, W, Ag, or Au. In some embodiments, the conductive vias 281, 283, and 285 may further include a barrier material such as Ta, Ti, TaN, or TiN to prevent the metal material from diffusing into the insulating structure 210.

The lines 280L may be arranged on the second surface S2 of the insulating structure 210. The lines 280L may connect the conductive plate 211 to the second line structure 250. The lines 280L may be formed to cross the conductive plate 211 and be spaced apart from each other. The lines 280L may be electrically connected to the conductive plate 211 through the first conductive via 281, and may be electrically connected to the conductive lines 213 through the second conductive via 283. In some embodiments, the lines 280L may include at least one metal material such as Cu, Al, W, Ag, or Au.

The I/O pad 280P may be arranged on the second surface S2 of the insulating structure 210. The I/O pad 280P may connect the peripheral circuit PC to a memory controller (not shown). A portion of a top surface of the I/O pad 280P may be exposed by the third insulating layer 290. A connection structure such as a bonding wire may be bonded to the exposed top surface of the I/O pad 280P to be connected to the outside. In some embodiments, the I/O pad 280P may include at least one metal material such as Cu, Al, W, Ag, or Au.

The I/O pad 280P may be disposed at substantially the same level as the lines 280L. In addition, the I/O pad 280P may include substantially the same material as the lines 280L. This may result from the I/O pad 280P and the lines 280L being separated from each other by one material layer through a patterning operation. However, the inventive concept is not limited thereto, and the I/O pad 280P may be at a higher level than that of the lines 280L.

The third insulating layer 290 may be arranged on the second surface S2 of the insulating structure 210 to surround the lines 280L and the I/O pad 280P. An open hole 290H exposing a portion of the top surface of the I/O pad 280P may be arranged in the third insulating layer 290. The third insulating layer 290 may include, for example, silicon nitride, silicon oxide, a low-k material, or a combination thereof.

As noted above, in order to meet emerging performance demands at acceptable cost, it is necessary to increase the degree of integration of integrated circuit devices. In particular, the degree of integration of memory devices is an important factor in determining the price competitiveness of a product. Accordingly, a vertical memory device having a three-dimensional structure is required. Here, an integrated circuit device electrically connects a conductive plate to a common source line driver by forming a through electrode in a partial region of a memory cell array. Accordingly, a memory cell may not be arranged in the partial region (hereafter referred to as a "through electrode region") of the memory cell array in which the through electrode is arranged.

According to the integrated circuit device 100 of FIGS. 1, 4A, 4B and 4C, in a vertical memory device, the lines 280L connecting the conductive plate 211 to the common source line driver 39 are formed on the second surface S2 of the insulating structure 210 in which the memory cell array MCA is not formed. Accordingly, it is not necessary to form a through electrode region in the memory cell array MCA of the integrated circuit device 100. As a result, the degree of integration may be increased by securing an arrangement region of memory cells. In addition, electrical resistance may be reduced by connecting the conductive plate 211 to the lines 280L using first conductive vias 281. Furthermore, because the I/O pad 280P and the lines 280L may be patterned from one material layer using a single photolithography/etching operation, overall productivity and cost efficiency may be improved.

Figure 5:
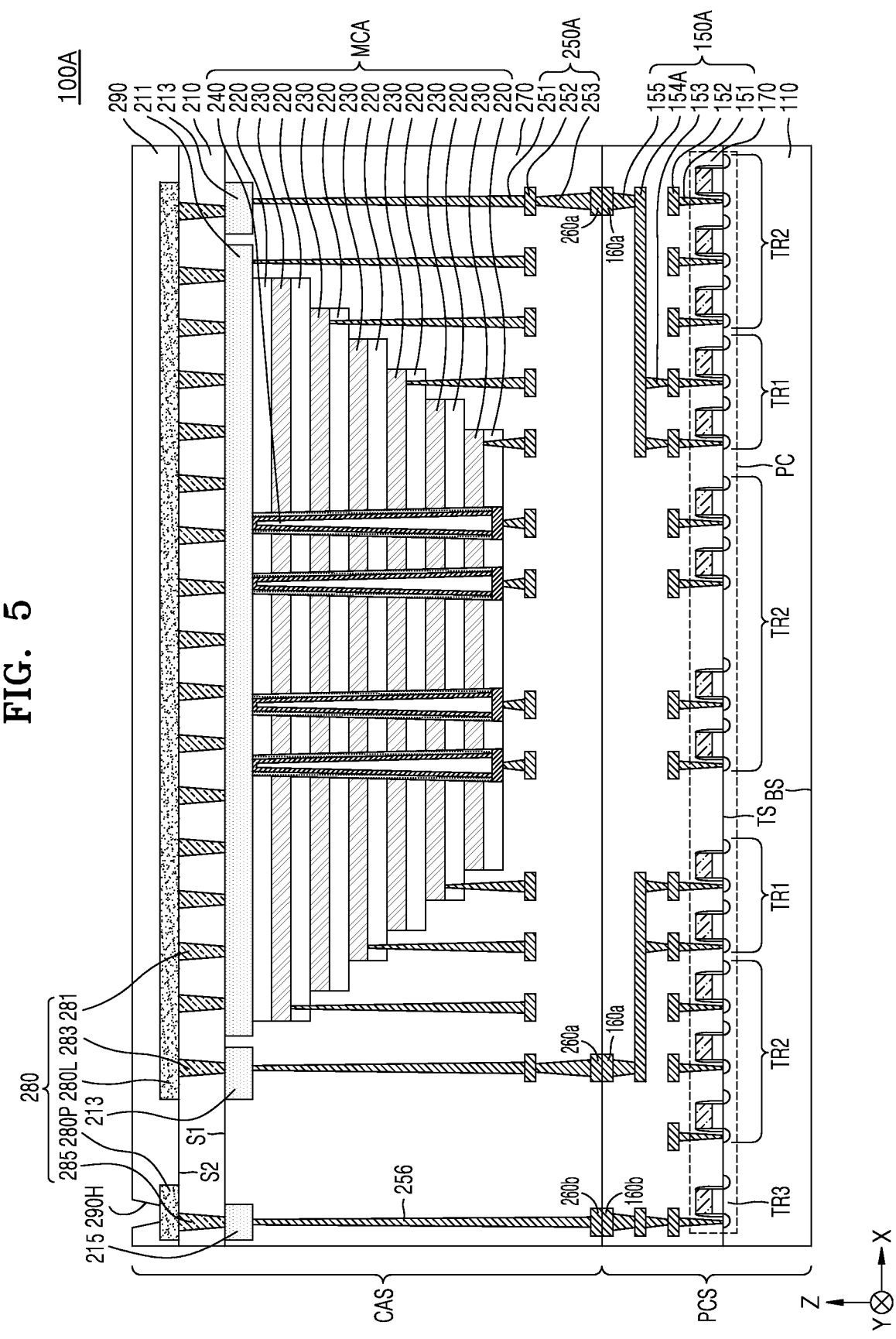
FIGS. 5, 6 and 7 are respective cross-sectional views illustrating integrated circuit devices according to embodiments of the inventive concept.
Figure 6:
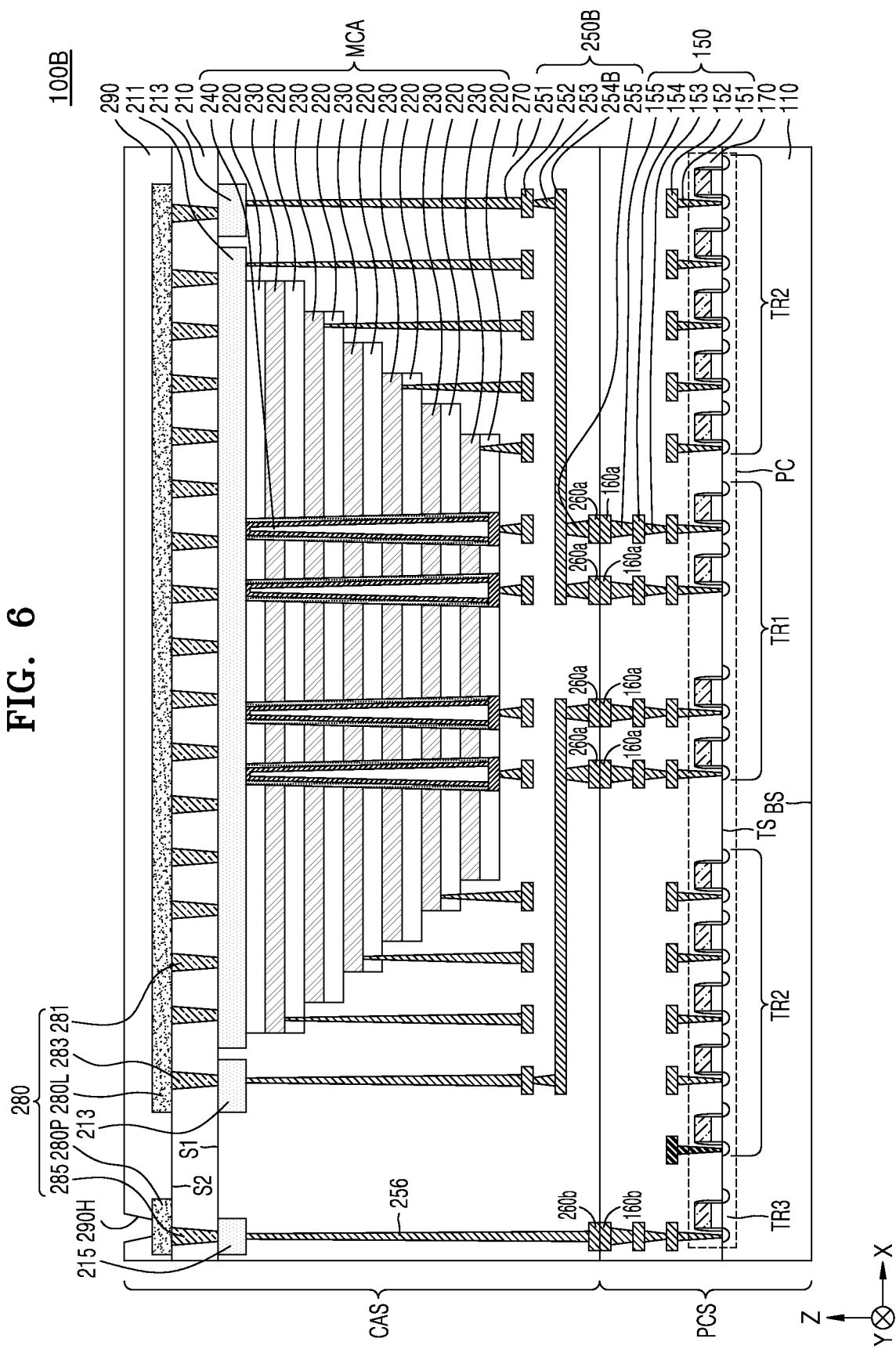
Figure 7:
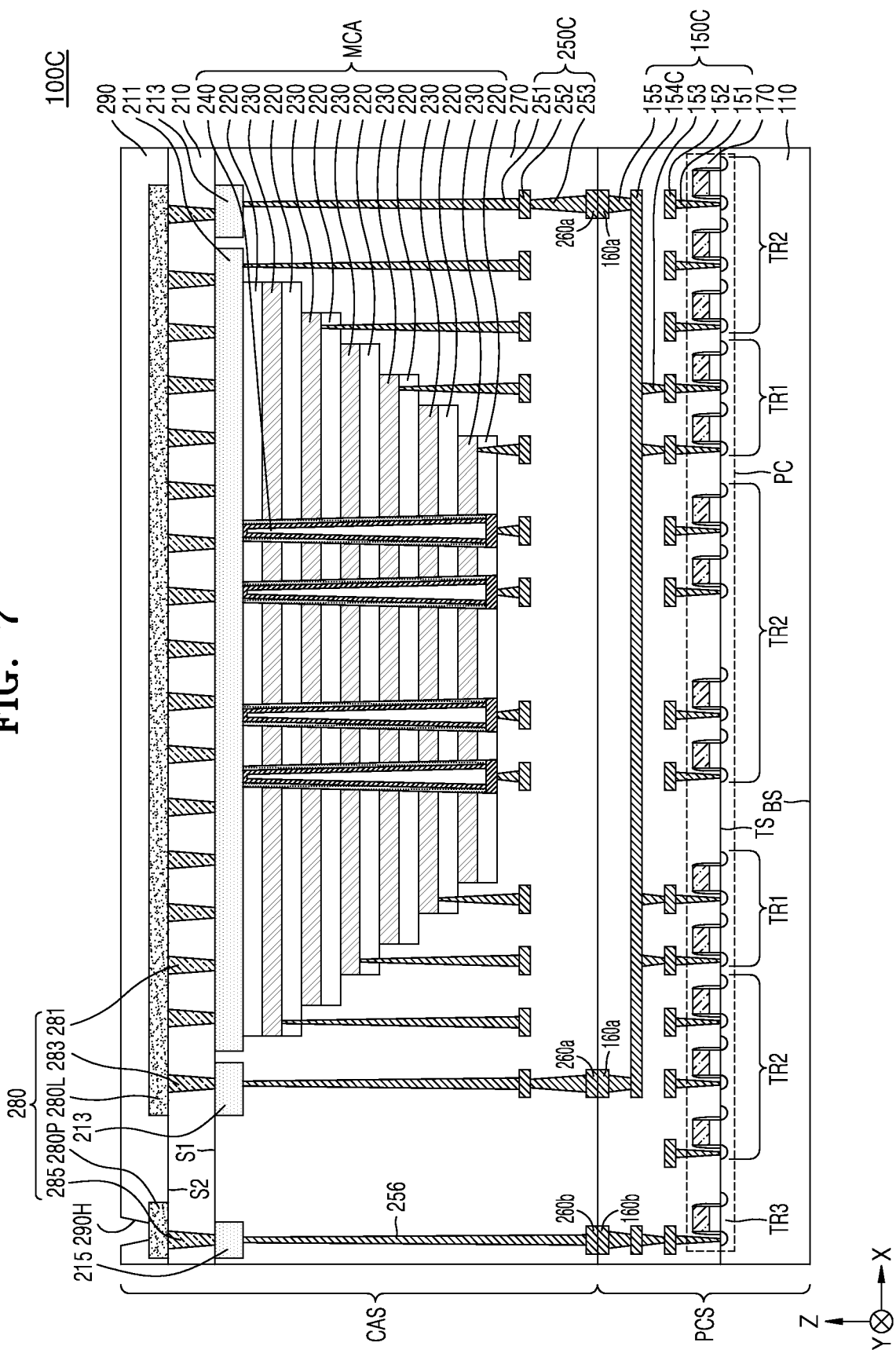

FIGS. 5, 6 and 7 are respective cross-sectional views illustrating integrated circuit devices 100A, 100B and 100C according to embodiments of the inventive concept. The integrated circuit devices 100A, 100B and 100C may be understood as possible variants on the integrated circuit device 100 of FIGS. 4A, 4B and 4C. Accordingly, only material differences between these respective embodiments will be highlighted below.

Referring to FIG. 5, the integrated circuit device 100A concept may include the peripheral circuit structure PCS and the cell array structure CAS vertically stacked on the peripheral circuit structure PCS.

In the integrated circuit device 100A, a first line structure 150A may connect the peripheral circuit PC to the first bonding pads 160a and 160b. The first line structure 150A may include the first contact plug 151, the first conductive line 152, the first via 153, a second conductive line 154A, and the second via 155.

That is, the first contact plug 151 may connect the first conductive line 152 to the peripheral circuit PC. The first via 153 may connect the second conductive line 154A to the first conductive line 152. The second via 155 may connect the first bonding pads 160a and 160b to the second conductive line 154A.

In the integrated circuit device 100A, the second conductive line 154A may include an extension line arranged in the first insulating layer 170 and electrically connecting the second contact plug 251 connected to the conductive lines 213 to the peripheral circuit PC. The second conductive line 154A may be disposed between the cell array structure CAS and the peripheral circuit PC. The second conductive line 154A may be electrically connected to each of second contact plugs 251 arranged at both ends of the memory cell array MCA. That is, the second conductive line 154A may not be configured as one extension line, but may be configured as two (2) separate extension lines.

A second line structure 250A may connect the third line structure 280 to the second bonding pads 260a and 260b. The second line structure 250A may include the second contact plug 251, the third conductive line 252, the third via 253, and the I/O contact plug 256.

That is, the second contact plug 251 may connect the third conductive line 252 to the memory cell array MCA or the conductive lines 213. The third via 253 may connect the second bonding pad 260a to the third conductive line 252. The I/O contact plug 256 may connect the second bonding pad 260b to the I/O pad 280P.

Referring to FIG. 6, the integrated circuit device 100B may include the peripheral circuit structure PCS and the cell array structure CAS vertically stacked on the peripheral circuit structure PCS.

In the integrated circuit device 100B, a second line structure 250B may connect the third line structure 280 to the second bonding pads 260a and 260b. The second line structure 250B may include the second contact plug 251, the third conductive line 252, the third via 253, a fourth conductive line 254B, the fourth via 255, and the I/O contact plug 256.

That is, the second contact plug 251 may connect the third conductive line 252 to the memory cell array MCA or the conductive lines 213. The third via 253 may connect the fourth conductive line 254B to the third conductive line 252. The fourth via 255 may connect the second bonding pad 260a to the fourth conductive line 254B. The I/O contact plug 256 may connect the second bonding pad 260b to the I/O pad 280P.

In the integrated circuit device 100B, the fourth conductive line 254B may include an extension line arranged in the second insulating layer 270 and electrically connected to the second contact plug 251 connected to the conductive lines 213. The fourth conductive line 254B may be between the memory cell array MCA and the peripheral circuit structure PCS. The fourth conductive line 254B may be electrically connected to each of second contact plugs 251 arranged at both ends of the memory cell array MCA. That, the fourth conductive line 254B may not configured as one extension line, but may be configured as two separate extension lines.

Referring to FIG. 7, the integrated circuit device 100C may include the peripheral circuit structure PCS and the cell array structure CAS vertically stacked on the peripheral circuit structure PCS.

In the integrated circuit device 100C, a first line structure 150C may connect the peripheral circuit PC to the first bonding pads 160a and 160b. The first line structure 150C may include the first contact plug 151, the first conductive line 152, the first via 153, a second conductive line 154C, and the second via 155.

That is, the first contact plug 151 may connect the first conductive line 152 to the peripheral circuit PC. The first via 153 may connect the second conductive line 154C to the first conductive line 152. The second via 155 may connect the first bonding pads 160a and 160b to the second conductive line 154C.

In the integrated circuit device 100C, the second conductive line 154C may include an extension line arranged in the first insulating layer 170 and electrically connecting the second contact plug 251 connected to the conductive lines 213 to the peripheral circuit PC. The second conductive line 154C may be between the cell array structure CAS and the peripheral circuit PC. The length of the second conductive line 154C may be greater than the length of the conductive plate 211.

A second line structure 250C may connect the third line structure 280 to the second bonding pads 260a and 260b. The second line structure 250C may include the second contact plug 251, the third conductive line 252, the third via 253, and the I/O contact plug 256.

That is, the second contact plug 251 may connect the third conductive line 252 to the memory cell array MCA or the conductive lines 213. The third via 253 may connect the second bonding pad 260a to the third conductive line 252. The I/O contact plug 256 may connect the second bonding pad 260b to the I/O pad 280P.

Figure 8:
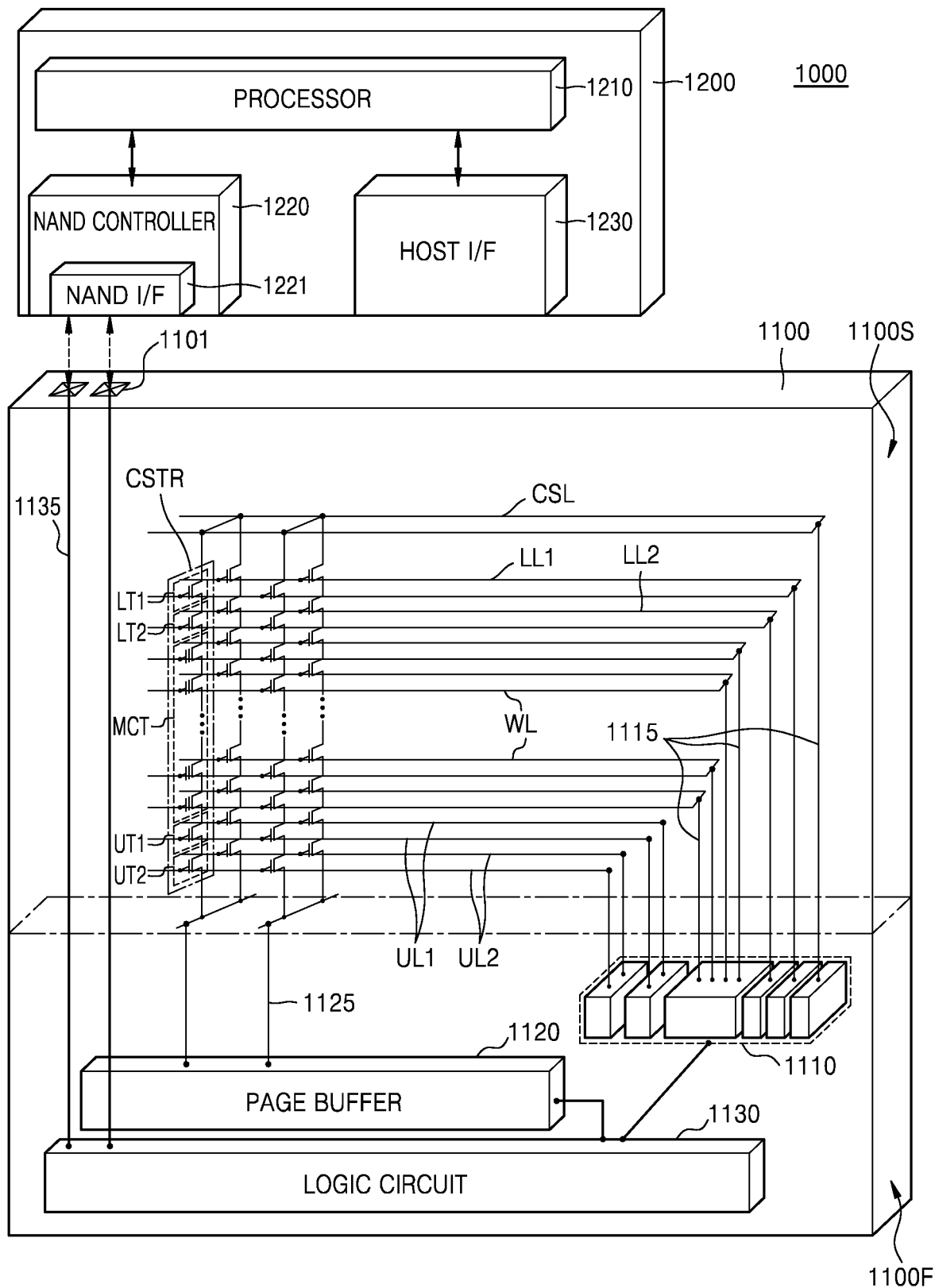
FIG. 8 is a diagram illustrating an electronic system including an integrated circuit device according to embodiments of the inventive concept.

FIG. 8 is a block diagram illustrating an electronic system 1000 including an integrated circuit device 1100 according to embodiments of the inventive concept.

Referring to FIG. 8, the electronic system 1000 may include the integrated circuit device 1100 and a controller 1200 electrically connected to the integrated circuit device 1100.

The electronic system 1000 may include a storage device including one or more integrated circuit devices 1100, or an electronic device including a storage device. For example, the electronic system 1000 may include a solid state drive (SSD) device, a universal serial bus (USB) device, a computing system, a medical device, or a communication device, which includes at least one integrated circuit device 1100.

The integrated circuit device 1100 may include a nonvolatile vertical memory device. For example, the integrated circuit device 1100 may include a NAND flash memory device including at least one of the integrated circuit devices 100, 100A, 100B and 100C described above with reference to FIGS. 4A, 4B, 4C 5, 6, and/or 7. The integrated circuit device 1100 may include a first structure 1100F and a second structure 1100S on the first structure 1100F. In some embodiments, the first structure 1100F may be arranged next to the second structure 1100S. The first structure 1100F may include a peripheral circuit structure including a decoder circuit 1110, a page buffer 1120, and a logic circuit 1130. The second structure 1100S may include a memory cell structure including a bit line, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and memory cell transistors MCT between the lower transistors LT1 and LT2 and the upper transistors UT1 and UT2. The number of lower transistors LT1 and LT2 and the number of upper transistors UT1 and UT2 may be variously changed according to embodiments.

In some embodiments, the upper transistors UT1 and UT2 may include a string selection transistor, and the lower transistors LT1 and LT2 may include a ground selection transistor. The gate lower lines LL1 and LL2 may respectively be gate electrodes of the lower transistors LT1 and LT2. The word line WL may be a gate electrode of the memory cell transistors MCT, and the gate upper lines UL1 and UL2 may respectively be gate electrodes of the upper transistors UT1 and UT2.

The common source line CSL, the gate lower lines LL1 and LL2, the word lines WL, and the gate upper lines UL1 and UL2 may be electrically connected to the decoder circuit 1110 through first connection lines 1115 extending from the first structure 1100F to the second structure 1100S. The bit lines BL may be electrically connected to the page buffer 1120 through second connection lines 1125 extending from the first structure 1100F to the second structure 1100S.

In the first structure 1100F, the decoder circuit 1110 and the page buffer 1120 may perform a control operation on at least one of the memory cell transistors MCT. The decoder circuit 1110 and the page buffer 1120 may be controlled by the logic circuit 1130.

The integrated circuit device 1100 may communicate with the controller 1200 through an I/O pad 1101 electrically connected to the logic circuit 1130. The I/O pad 1101 may be electrically connected to the logic circuit 1130 through an I/O connection line 1135 extending from the first structure 1100F to the second structure 1100S.

The controller 1200 may include a processor 1210, a NAND controller 1220, and a host interface (I/F) 1230. In some embodiments, the electronic system 1000 may include multiple integrated circuit devices 1100, and in this case, the controller 1200 may be used to control the integrated circuit devices 1100.

The processor 1210 may control the overall operation of the electronic system 1000 including the controller 1200. The processor 1210 may operate based on firmware and may control the NAND controller 1220 to access the integrated circuit device 1100. The NAND controller 1220 may include a NAND I/F 1221, which processes communication with the integrated circuit device 1100. A control command for controlling the integrated circuit device 1100, data to-be-written to memory cell transistors MCT of the integrated circuit device 1100, and data read from the memory cell transistors MCT of the integrated circuit device 1100 may be transmitted through the NAND I/F 1221. The host I/F 1230 may provide a communication function between the electronic system 1000 and an external host. When a control command is received from the external host through the host I/F 1230, the processor 1210 may control the integrated circuit device 1100 in response to the control command.

Figure 9:
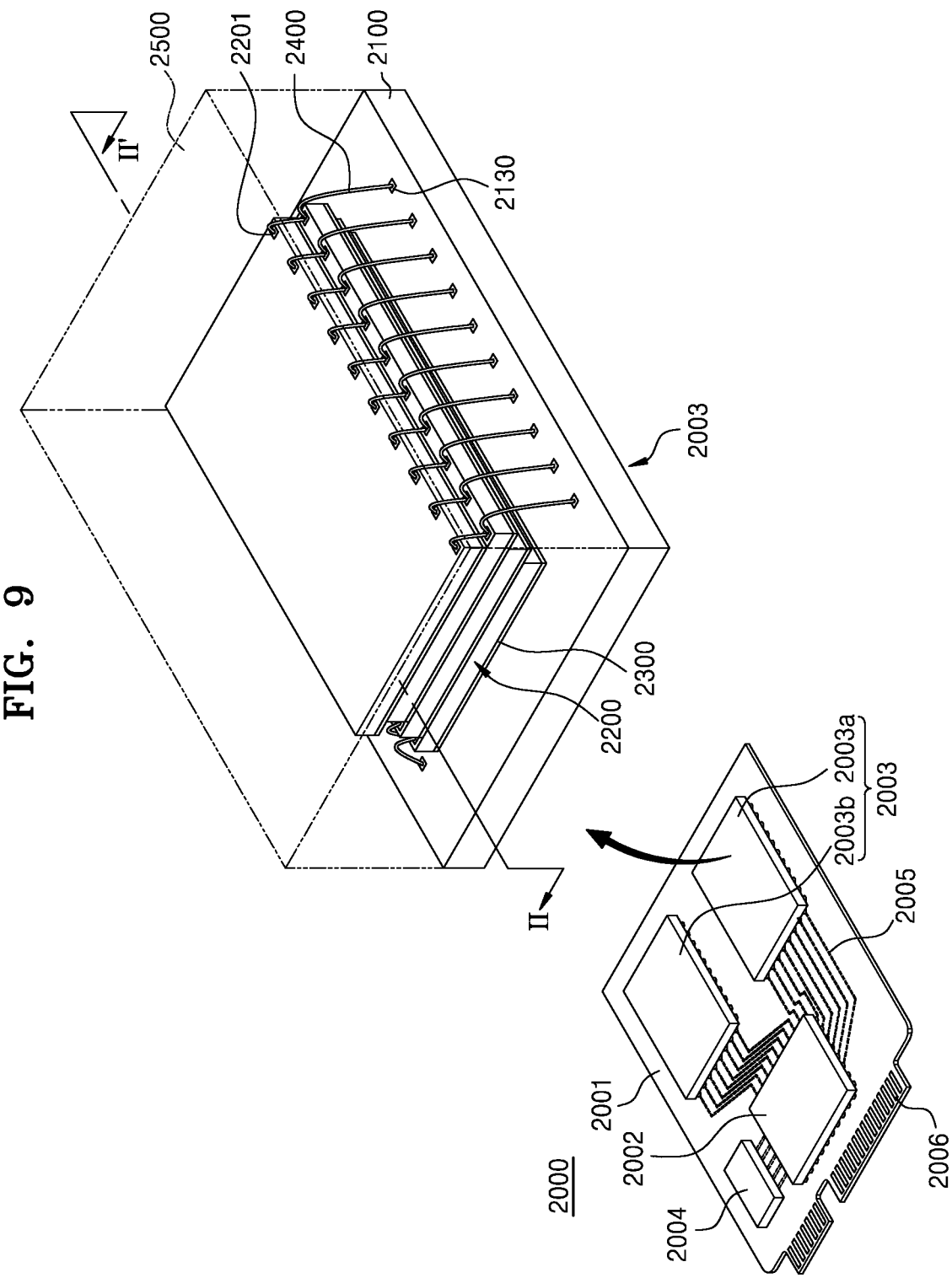
FIG. 9 is a perspective view illustrating an electronic system including an integrated circuit device according to embodiments of the inventive concept.

FIG. 9 is a perspective view illustrating an electronic system 2000 including an integrated circuit device according to embodiments of the inventive concept.

Referring to FIG. 9, the electronic system 2000 may include a main board 2001, a controller 2002 mounted on the main board 2001, one or more semiconductor packages 2003, and dynamic random access memory (DRAM) 2004. The one or more semiconductor packages 2003 and the DRAM 2004 may be connected to the controller 2002 through line patterns 2005 formed on the main board 2001.

The main board 2001 may include a connector 2006 including pins coupled to an external host. The number and arrangement of the pins in the connector 2006 may be changed according to a communication interface between the electronic system 2000 and the external host. In some embodiments, the electronic system 2000 may communicate with the external host according to one of interfaces such as USB, Peripheral Component Interconnect Express (PCI-Express), Serial Advanced Technology Attachment (SATA), and M-Phy for Universal Flash Storage (UFS). In some embodiments, the electronic system 2000 may operate based on power supplied from the external host through the connector 2006. The electronic system 2000 may further include a power management integrated circuit (PMIC) that distributes the power supplied from the external host to the controller 2002 and the one or more semiconductor packages 2003.

The controller 2002 may write data in the one or more semiconductor packages 2003 or may read data from the one or more semiconductor packages 2003, and may improve an operation speed of the electronic system 2000.

The DRAM 2004 may include a buffer memory for reducing a speed difference between the external host and the one or more semiconductor packages 2003, which is a data storage space. The DRAM 2004 included in the electronic system 2000 may operate as a type of cache memory and may provide a space for arbitrarily storing data in a control operation performed on the one or more semiconductor packages 2003. When the DRAM 2004 is included in the electronic system 2000, the controller 2002 may further include a DRAM controller for controlling the DRAM 2004, in addition to a NAND controller for controlling the one or more semiconductor packages 2003.

The one or more semiconductor packages 2003 may include first and second semiconductor packages 2003a and 2003b, which are apart from each other. Each of the first and second semiconductor packages 2003a and 2003b may include a semiconductor package including multiple semiconductor chips 2200. Each of the first and second semiconductor packages 2003a and 2003b may include a package substrate 2100, the semiconductor chips 2200 on the package substrate 2100, an adhesive layer 2300 on a bottom surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may include a printed circuit board including package upper pads 2130. Each of the semiconductor chips 2200 may include an I/O pad 2201. The I/O pad 2201 may correspond to the I/O pad 1101 of FIG. 8. Each of the semiconductor chips 2200 may include at least one the integrated circuit devices 100, 100A, 100B, and 100C described above with reference to FIGS. 4A, 4B, 4C, 5, 6, and/or 7.

In some embodiments, the connection structure 2400 may include a bonding wire that electrically connects the I/O pad 2201 to each of the package upper pads 2130. Therefore, in the first and second semiconductor packages 2003a and 2003b, the semiconductor chips 2200 may be electrically connected to each other in a bonding wire manner and may be electrically connected to the package upper pads 2130 of the package substrate 2100. In some embodiments, in the first and second semiconductor packages 2003a and 2003b, the semiconductor chips 2200 may be electrically connected to each other by a connection structure including a through silicon via (TSV) instead of the connection structure 2400 of a bonding wire manner.

In some embodiments, the controller 2002 and the semiconductor chips 2200 may be included in one package. In some embodiments, the controller 2002 and the semiconductor chips 2200 may be mounted on a separate interposer substrate that differs from the main board 2001, and the controller 2002 and the semiconductor chips 2200 may be electrically connected to each other by a line formed on the interposer substrate.

Figure 10:
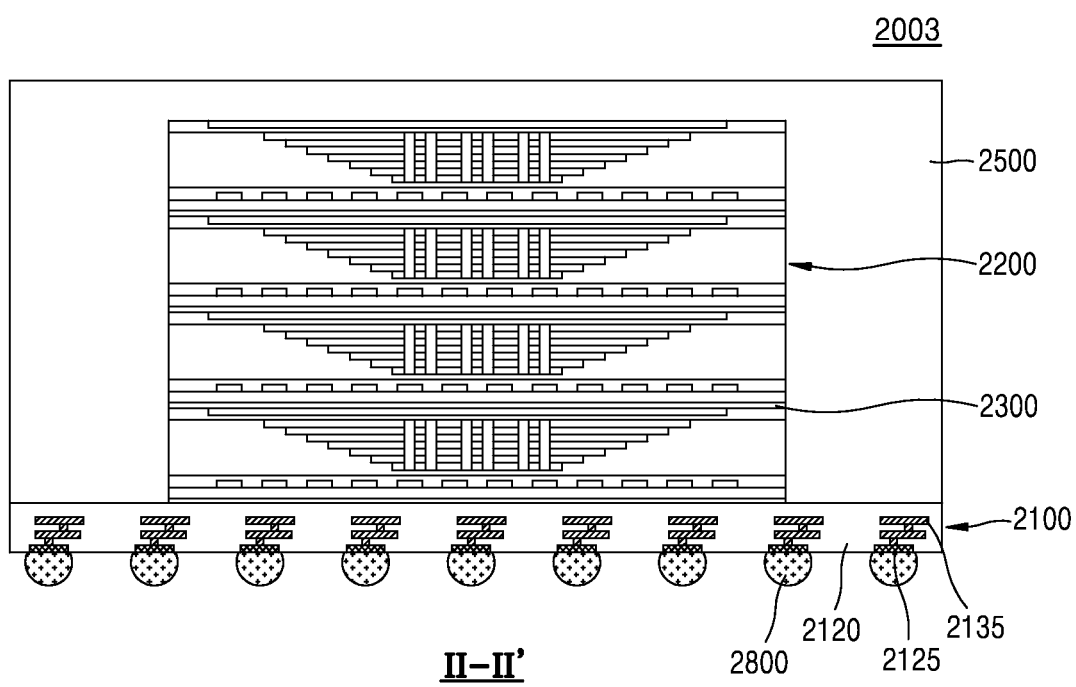
FIG. 10 is a cross-sectional view illustrating a semiconductor package including an integrated circuit device according to embodiments of the inventive concept.

FIG. 10 is a cross-sectional view illustrating in one example the semiconductor package 2003 of FIG. 9 including an integrated circuit device according to embodiments of the inventive concept.

Referring to FIGS. 9 and 10, in the semiconductor package 2003, a package substrate 2100 may include a printed circuit board (PCB).

The package substrate 2100 may include a body portion 2120, the package upper pads 2130 on a top surface of the body portion 2120, package lower pads 2125 on a bottom surface of the body portion 2120 or exposed through the bottom surface of the body portion 2120, and an internal line 2135 electrically connecting the package upper pads 2130 to the package lower pads 2125 in the body portion 2120.

The package lower pads 2125 may be connected to the line patterns 2005 on the main substrate 2001 through conductive bumps 2800. Each of the semiconductor chips 2200 may include at least one of the integrated circuit devices 100, 100A, 100B and 100C described above with reference to FIGS. 4A, 4B, 4C, 5, 6 and/or 7.

FIGS. 11A, 11B, 11C, 11D and 11E (hereafter collectively, "FIGS. 11A to 11E") are related cross-sectional views illustrating in one example a method of manufacturing an integrated circuit device according to embodiments of the inventive concept.

Figure 11A:
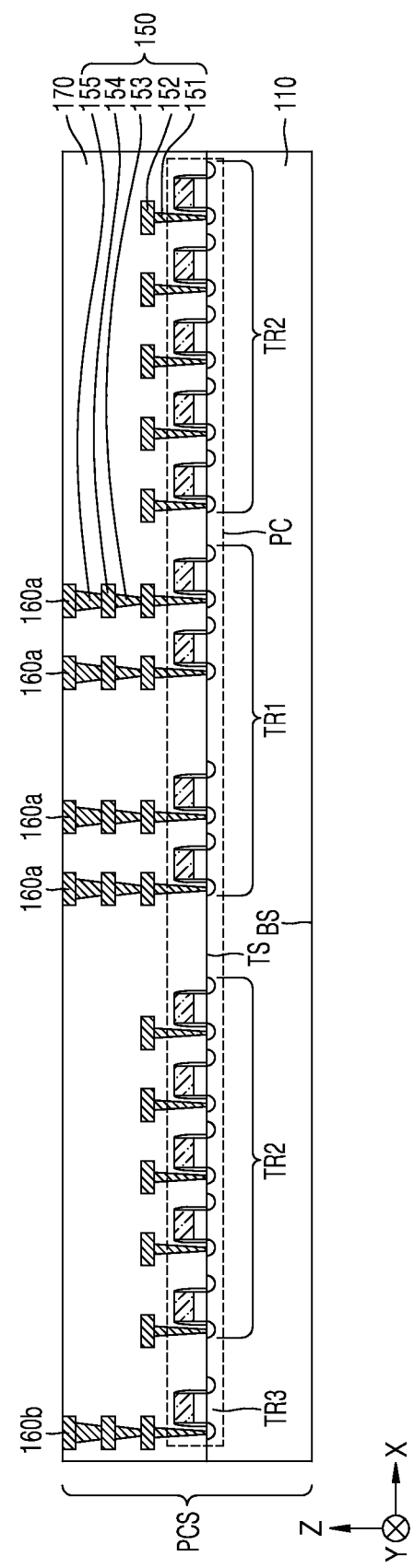
FIGS. 11A, 11B, 11C, 11D and 11E are related cross-sectional views illustrating, in one example a method of manufacturing an integrated circuit device according to embodiments of the inventive concept.

Referring to FIG. 11A, the peripheral circuit structure PCS may be formed.

The peripheral circuit structure PCS may include the circuit substrate 110, the peripheral circuit PC on the top surface TS of the circuit substrate 110, the first insulating layer 170 covering the circuit substrate 110 and the peripheral circuit PC, and the first bonding pads 160a and 160b arranged in the first insulating layer 170. In addition, the peripheral circuit structure PCS may include the first line structure 150.

Figure 11B:
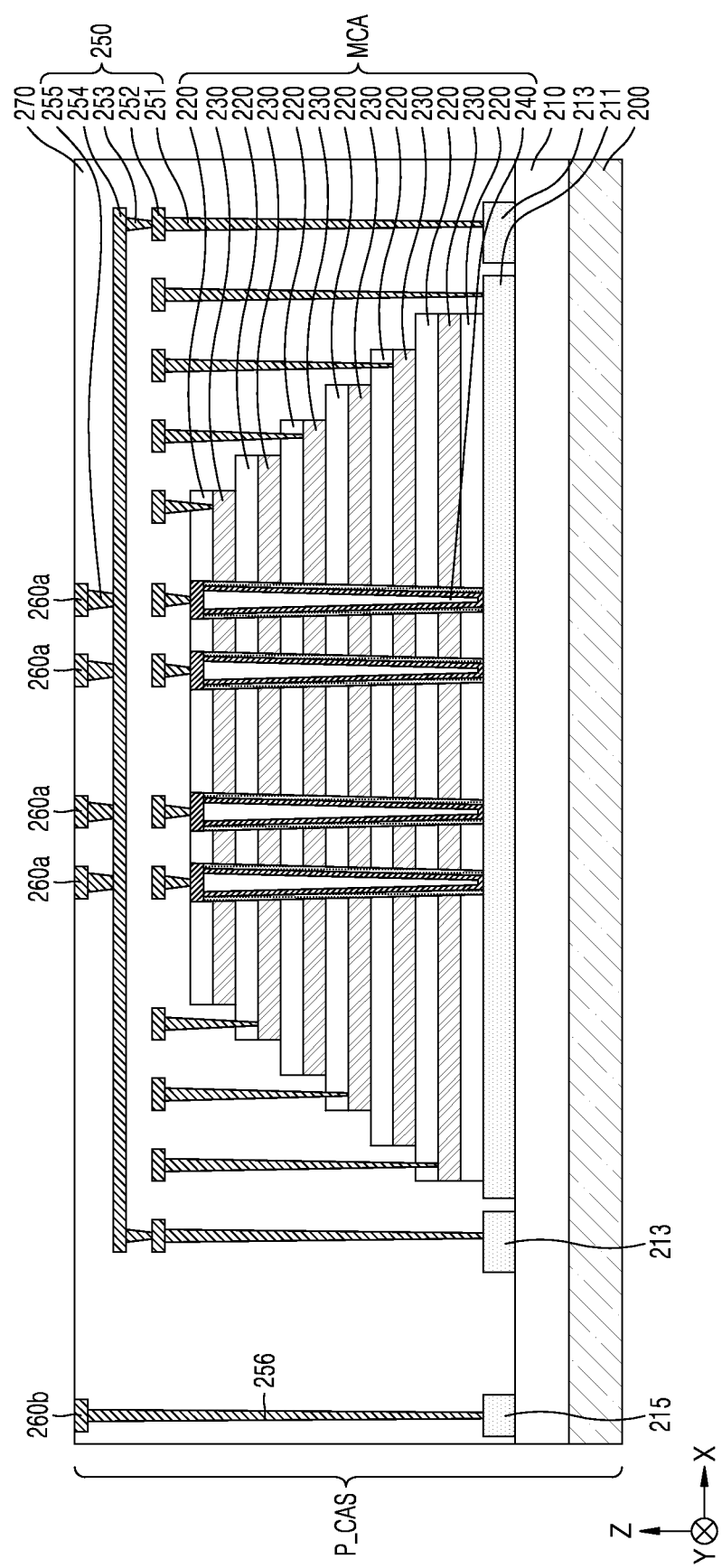

Referring to FIG. 11B, a preliminary cell array structure P_CAS, which is a portion of the cell array structure CAS (see FIG. 4A), may be formed.

The preliminary cell array structure P_CAS may include a base substrate 200, the insulating structure 210, the conductive plate 211 on the first surface S1 of the insulating structure 210, conductive lines 213 arranged on both side surfaces of the conductive plate 211, the memory cell array MCA on the conductive plate 211, the second insulating layer 270 covering the insulating structure 210 and the memory cell array MCA, and the second bonding pads 260a and 260b arranged in the second insulating layer 270. In addition, the preliminary cell array structure P_CAS may include the second line structure 250. However, the preliminary cell array structure P_CAS may not include the third line structure 280 of 4A.

Figure 11C:
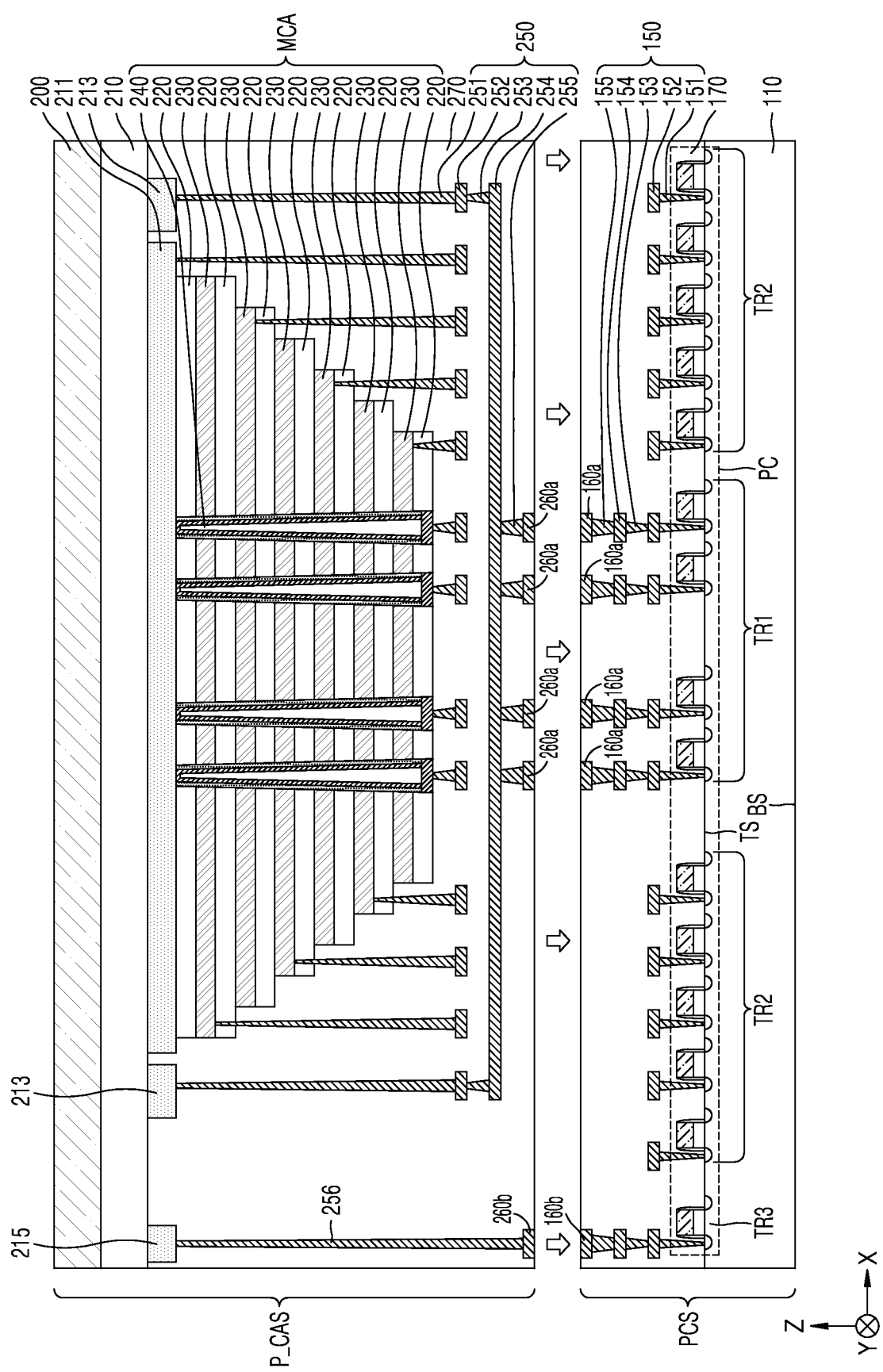

Referring to FIG. 11C, after aligning the preliminary cell array structure P_CAS to overlap the peripheral circuit structure PCS in the vertical direction, the first bonding pads 160a and 160b included in the peripheral circuit structure PCS and the second bonding pads 260a and 260b included in the preliminary cell array structure P_CAS may be bonded to each other.

In some embodiments, the first bonding pads 160a and 160b included in the peripheral circuit structure PCS and the second bonding pads 260a and 260b included in the preliminary cell array structure P_CAS may be directly bonded to each other without a separate adhesive layer by pressing the preliminary cell array structure P_CAS in the direction indicated by the arrows in FIG. 11C. For example, the first bonding pads 160a and 160b and the second bonding pads 260a and 260b may be respectively bonded to each other by pressing the first bonding pads 160a and 160b and the second bonding pads 260a and 260b together with sufficient force to form an atomic level bond.

In other embodiments, before bonding the first bonding pads 160a and 160b and the second bonding pads 260a and 260b, a surface treatment operation such as a hydrogen plasma treatment or the like may be further performed on a surface of the preliminary cell array structure P_CAS to which the first bonding pads 160a and 160b are exposed and a surface of the peripheral circuit structure PCS to which the second bonding pads 260a and 260b are exposed to strengthen the adhesive strength of each of the first bonding pads 160a and 160b and the second bonding pads 260a and 260b.

Figure 11D:
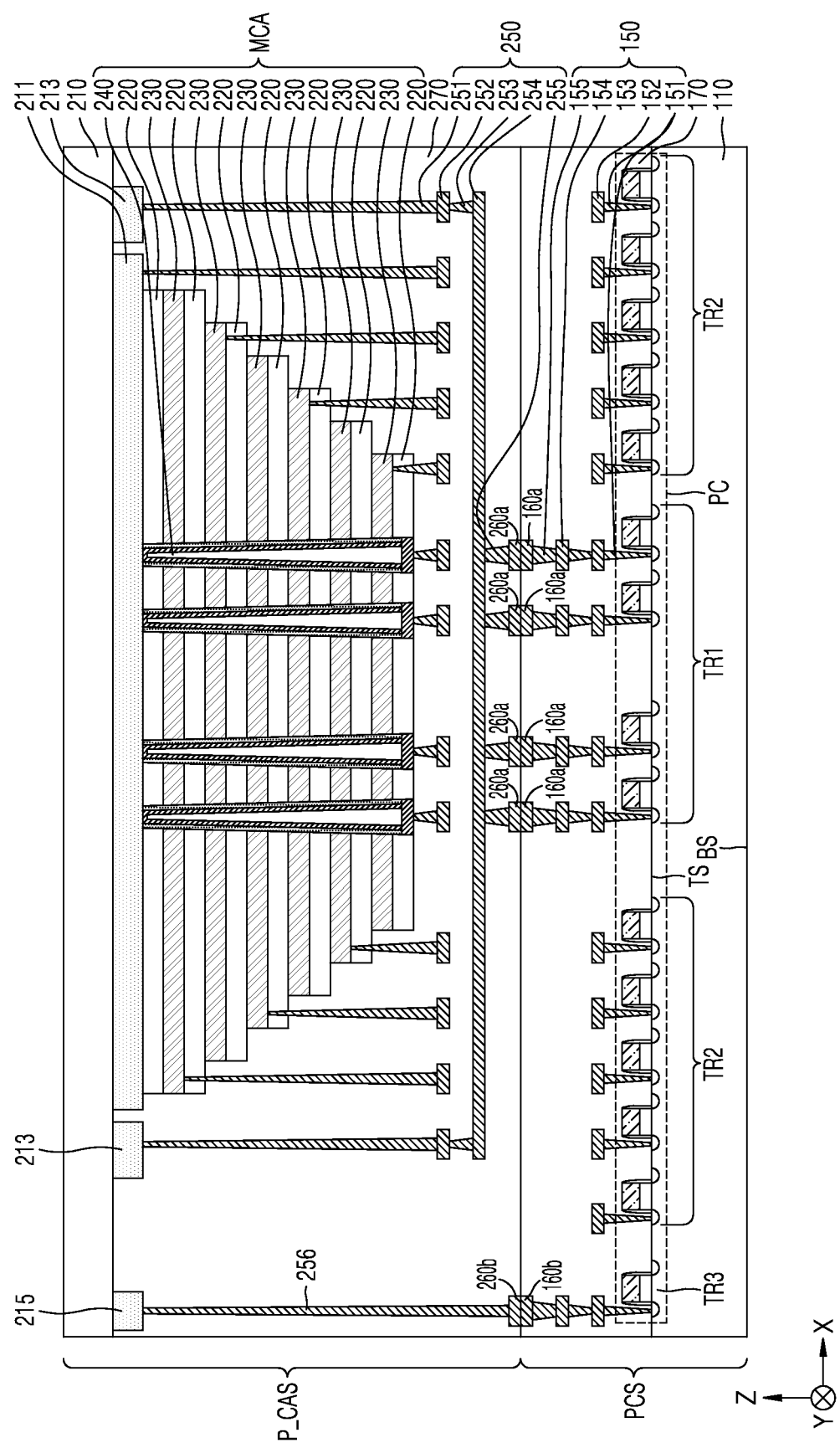

Referring to FIG. 11D, the second surface S2 of the insulating structure 210 may be exposed by removing the base substrate 200 of FIG. 11C from the preliminary cell array structure P_CAS.

In some embodiments, a grinding operation, a wet-etching operation, a dry-etching operation, or a combination thereof may be used to remove the base substrate 200.

Figure 11E:
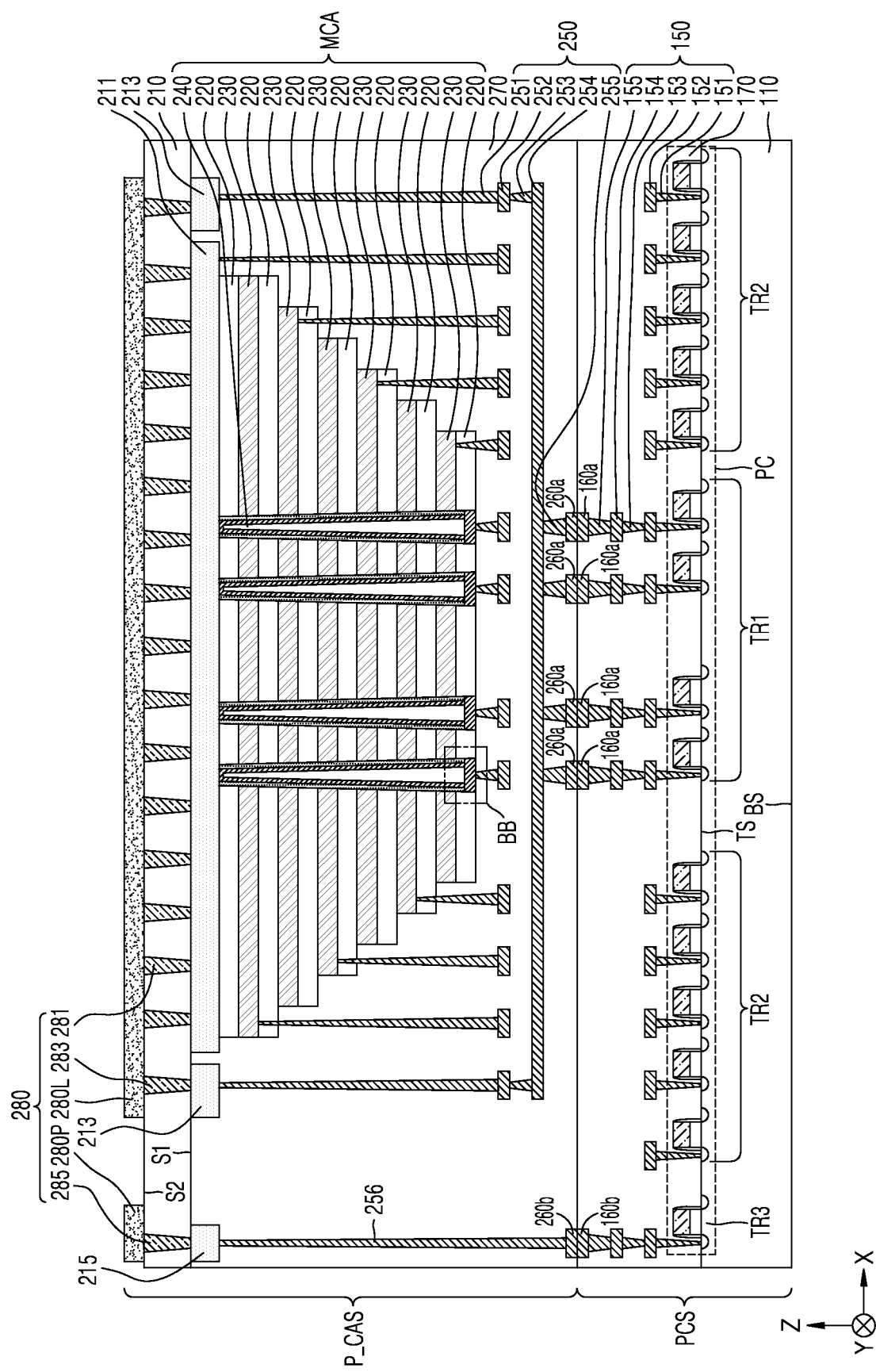

Referring to FIG. 11E, the third line structure 280 may be formed in the preliminary cell array structure P_CAS.

First, a via hole exposing the conductive plate 211, the conductive lines 213, and the conductive pad 215 may be formed by removing a portion of the insulating structure 210, and the conductive vias 281, 283, and 285 may be formed in the via hole. Next, the lines 280L and the I/O pad 280P may be formed on the insulating structure 210.

Referring to FIG. 4A again, the integrated circuit device 100 of the inventive concept may be completed by forming the third insulating layer 290 covering the lines 280L and the I/O pad 280P and forming the open hole 290H exposing the top surface of the I/O pad 280P.

The method of manufacturing the integrated circuit device 100 illustrated in FIGS. 4A, 4B and 4C has been described with reference to FIGS. 11A to 11E, but methods of manufacturing the integrated circuit devices 100A, 100B and 100C illustrated in FIGS. 5, 6 and 7 will be apparent to those skilled in the art upon modifying the method described above.

Figure 12:
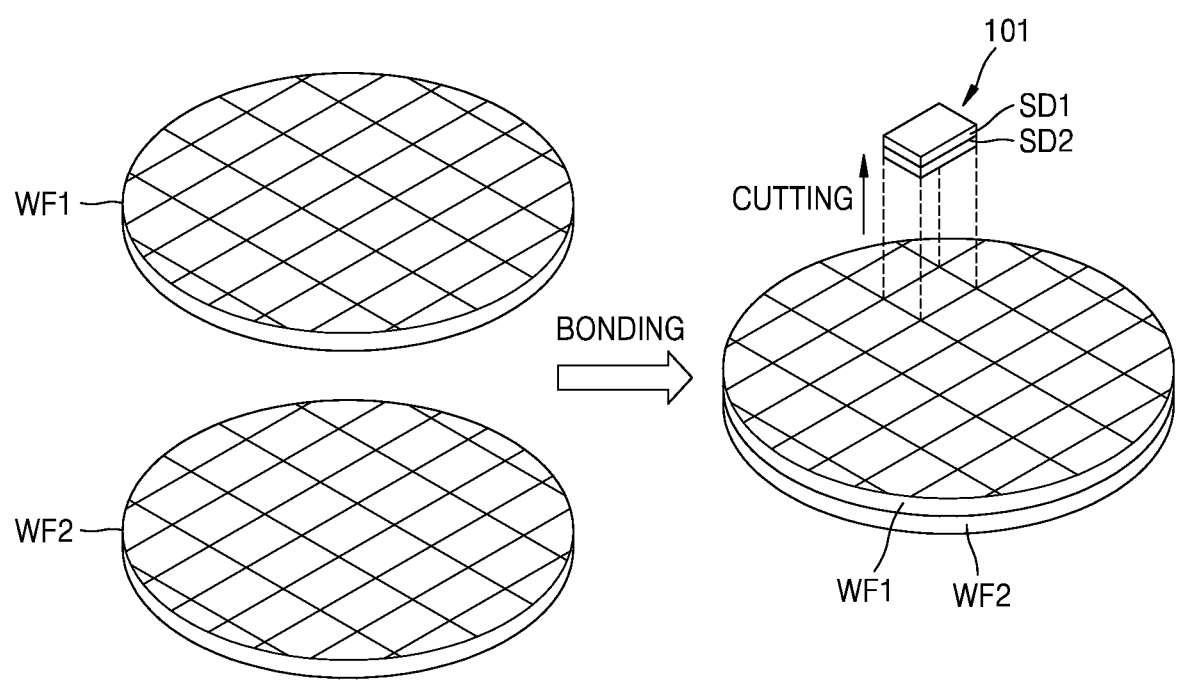
FIG. 12 is a diagram illustrating in one example a method of manufacturing an integrated circuit device according to embodiments of the inventive concept.

FIG. 12 is a perspective diagram illustrating in one example a method of manufacturing an integrated circuit device according to embodiments of the inventive concept.

Referring to FIGS. 8 and 12, the first structure 1100F may be formed on a first wafer WF1, and the second structure 1100S may be formed on a second wafer WF2.

Chips 101 may be formed by adhering the first wafer WF1 to the second wafer WF2 and cutting the first wafer WF1 and the second wafer WF2 in a state where the first wafer WF1 and the second wafer WF2 are adhered to each other.

Each of the chips 101 may include a first semiconductor die SD1 and a second semiconductor die SD2, which are vertically stacked on each other. The chips 101 may include at least one of the integrated circuit devices 100, 100A, 100B and 100C described above with reference to FIGS. 4A, 4B, 4C, 5, 6, and/or 7. The first semiconductor die SD1 is obtained from the first wafer WF1 and may include the cell array structure CAS described above. The second semiconductor die SD2 is obtained from the second wafer WF2 and may include the peripheral circuit structure PCS described above.

While the inventive concept has been particularly shown and described with reference to embodiments thereof, it will be understood that various changes in form and details may be made therein without departing from the spirit and scope of the inventive concept as defined by the following claims.

What is claimed is:

1. An integrated circuit device comprising:
a peripheral circuit structure and a cell array structure,
wherein the peripheral circuit structure includes a circuit substrate, a peripheral circuit on the circuit substrate, a first insulating layer covering the circuit substrate and the peripheral circuit, and a first bonding pad in the first insulating layer,
the cell array structure includes an insulating structure having a first surface and an opposing second surface, a conductive plate on the first surface of the insulating structure, a memory cell array on the conductive plate, a second insulating layer covering the first surface of the insulating structure, the conductive plate, and the memory cell array, a second bonding pad arranged in the second insulating layer in contact with the first bonding pad, a line on the second surface of the insulating structure, and a conductive via penetrating the insulating structure and connecting the conductive plate to the line, and
the integrated circuit device further comprises contact plugs electrically connecting the line to the peripheral circuit.

2. The integrated circuit device of claim 1, further comprising:
conductive lines arranged on both sides of the conductive plate, electrically connected to the line, and disposed at a same level as that of the conductive plate.

3. The integrated circuit device of claim 2, wherein the line extends across the conductive plate to electrically connect the conductive lines arranged on both sides of the conductive plate.

4. The integrated circuit device of claim 3, wherein the contact plugs respectively contact the conductive lines, and
the integrated circuit device further comprises an extension line arranged in the second insulating layer to electrically connect the contact plugs.

5. The integrated circuit device of claim 4, wherein the extension line is disposed between the memory cell array and the peripheral circuit structure, and
a length of the extension line is greater than a length of the conductive plate.

6. The integrated circuit device of claim 4, wherein the extension line is disposed between the memory cell array and the peripheral circuit structure, and
a length of the extension line is less than a length of the conductive plate.

7. The integrated circuit device of claim 4, wherein the extension line is electrically connects the second bonding pad.

8. The integrated circuit device of claim 7, wherein the peripheral circuit electrically connects the extension line and includes a common source line driver.

9. The integrated circuit device of claim 1, wherein the contact plugs have a trapezoidal shape defined by a width increasing as a distance from the conductive plate increases, and
the conductive via has an inverted trapezoidal shape defined by a width increasing as the distance from the conductive plate increases.

10. The integrated circuit device of claim 1, further comprising:
an input/output pad arranged on the second surface of the insulating structure to electrically connect the peripheral circuit.

11. An integrated circuit device comprising:
a peripheral circuit structure including a peripheral circuit, a first insulating layer covering the peripheral circuit, extension lines in the first insulating layer, and a first bonding pad in the first insulating layer; and
a cell array structure including a conductive plate, a memory cell array below the conductive plate, a second insulating layer covering the memory cell array, a second bonding pad in the second insulating layer, a conductive via on the conductive plate, and a line connected to the conductive via,
wherein the first bonding pad contacts the second bonding pad, and
the integrated circuit device further includes contact plugs electrically connecting the line to the extension lines.

12. The integrated circuit device of claim 11, further comprising:
conductive lines arranged on both sides of the conductive plate, electrically connected to the line, and disposed at a same level as the conductive plate.

13. The integrated circuit device of claim 12, wherein the line extends across the conductive plate to electrically connect the conductive lines arranged on both sides of the conductive plate.

14. The integrated circuit device of claim 13, wherein one end of each of the contact plugs respectively contacts the conductive lines and another end of each one of the contact plugs connects the second bonding pad, and
a top surface of the extension lines is connected to the first bonding pad.

15. The integrated circuit device of claim 13, wherein the conductive lines include a first conductive line and a second conductive line, such that the conductive plate is arranged between the first conductive line and the second conductive line, and
the extension lines includes a first extension line connected to the first conductive line, and a second extension line connected to the second conductive line.

16. The integrated circuit device of claim 11, wherein the peripheral circuit connected to the extension lines includes a common source line driver.

17. The integrated circuit device of claim 11, further comprising:
an input/output pad arranged above the conductive plate at a same level as the line.

18. The integrated circuit device of claim 11, further comprising:
an input/output pad arranged above the conductive plate at a higher level than the line.

19. An electronic system comprising:
a main substrate;
an integrated circuit device on the main substrate; and
a controller electrically connected to the integrated circuit device on the main substrate,
wherein the integrated circuit device comprises:
- a peripheral circuit structure including a peripheral circuit, a first insulating layer covering the peripheral circuit, a first bonding pad in the first insulating layer; and
- a cell array structure including a conductive plate, a memory cell array below the conductive plate, a second insulating layer covering the memory cell array, a second bonding pad in the second insulating layer, a conductive via on the conductive plate, and a line connected to the conductive via,
- wherein the first bonding pad contacts the second bonding pad, and
the integrated circuit device further comprises contact plugs electrically connecting the line to the peripheral circuit.

20. The electronic system of claim 19, wherein the main substrate further comprises line patterns electrically connecting the integrated circuit device to the controller, and
the integrated circuit device further comprises an extension line arranged in the second insulating layer to electrically connect the contact plugs.

* * * * *